(12) United States Patent
Kim

(10) Patent No.: US 8,344,989 B2
(45) Date of Patent: Jan. 1, 2013

(54) SHIFT REGISTER

(75) Inventor: Hong Jae Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1104 days.

(21) Appl. No.: 12/257,848

(22) Filed: Oct. 24, 2008

(65) Prior Publication Data

US 2009/0167668 A1 Jul. 2, 2009

(30) Foreign Application Priority Data

Dec. 31, 2007 (KR) .................. 10-2007-0141546
Jun. 27, 2008 (KR) .................. 10-2008-0061604

(51) Int. Cl.
*G09G 3/36* (2006.01)
(52) U.S. Cl. ......................................... 345/100; 377/64
(58) Field of Classification Search .................. 345/100, 345/94, 145; 377/64
See application file for complete search history.

(56) References Cited

U.S. PATENT DOCUMENTS

| 2003/0227433 A1* | 12/2003 | Moon ........................... 345/100 |
| 2004/0190323 A1* | 9/2004 | Ashizawa et al. .............. 365/145 |
| 2007/0001991 A1* | 1/2007 | Jang et al. ...................... 345/100 |
| 2007/0109250 A1* | 5/2007 | Woo .............................. 345/100 |
| 2007/0216634 A1* | 9/2007 | Kim et al. ....................... 345/100 |
| 2007/0297559 A1* | 12/2007 | Cho et al. ......................... 377/64 |

FOREIGN PATENT DOCUMENTS

| CN | 1868003 A | 11/2006 |
| CN | 1941063 A | 4/2007 |
| JP | 2004-157508 A | 6/2004 |

OTHER PUBLICATIONS

Japanese Office Action dated Aug. 16, 2011.
Chinese Office Action dated Apr. 27, 2011 with English translation.

\* cited by examiner

*Primary Examiner* — Quan-Zhen Wang
*Assistant Examiner* — Yuk Chow
(74) *Attorney, Agent, or Firm* — Morgan, Lewis & Bockius LLP

(57) ABSTRACT

A shift register includes a plurality of scan stages to output scan pulses to a plurality of gate lines, a first dummy stage to output a first dummy scan pulse to a first of the plurality of scan stages, and a second dummy stage to output a second dummy scan pulse to a last of the plurality of scan stages.

7 Claims, 9 Drawing Sheets

SHIFT REGISTER

This application claims the benefit of both Korean Patent Applications No. 10-2007-0141546 filed on Dec. 31, 2007, and Patent Application No. 10-2008-0061604 filed on Jun. 27, 2008 which are hereby incorporated by reference as if fully set forth herein.

BACKGROUND OF THE INVENTION

1. Field of the Invention

The present invention relates to a shift register, and more particularly, to a shift register in which the output order of stages can be changed.

2. Discussion of the Related Art

In general, a liquid crystal display device is adapted to display an image by adjusting light transmittance of a liquid crystal using an electric field. To this end, the liquid crystal display device includes a liquid crystal panel having pixel areas arranged in matrix form, and a driving circuit for driving the liquid crystal panel.

In the liquid crystal panel, a plurality of gate lines and a plurality of data lines are arranged to intersect each other, and pixel areas are located respectively in areas defined by the intersections of the gate lines and the data lines. A pixel electrode and a common electrode for application of an electric field to each of the pixel areas are formed in the liquid crystal panel. Each pixel electrode is connected to a corresponding one of the data lines via the source terminal and drain terminal of a thin film transistor (TFT), which is a switching device. The TFT is turned on by a scan pulse applied to the gate terminal thereof via a corresponding one of the gate lines to charge a data signal from the corresponding data line in the pixel electrode.

The driving circuit includes a gate driver for driving the gate lines, a data driver for driving the data lines, a timing controller for supplying control signals for control of the gate driver and data driver, and a power supply for supplying various driving voltages to be used in the liquid crystal display device. The gate driver sequentially supplies scan pulses to the gate lines to sequentially drive liquid crystal cells in the liquid crystal panel on a line-by-line basis. Here, the gate driver comprises a shift register to sequentially output the scan pulses as mentioned above.

A conventional shift register includes a plurality of stages for outputting the scan pulses in fixed order. The stages output the scan pulses in one direction, namely, in order from a top stage to a bottom stage. That is, the shift register outputs the scan pulses in only one direction. For this reason, the conventional shift register involves many problems to be used in liquid crystal display devices of various models.

SUMMARY OF THE INVENTION

Accordingly, the present invention is directed to a shift register that substantially obviates one or more problems due to limitations and disadvantages of the related art. An object of the present invention is to provide a shift register which controls the output order of scan pulses.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, a shift register includes a plurality of scan stages to output scan pulses to a plurality of gate lines, a first dummy stage to output a first dummy scan pulse to a first of the plurality of scan stages, and a second dummy stage to output a second dummy scan pulse to a last of the plurality of scan stages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
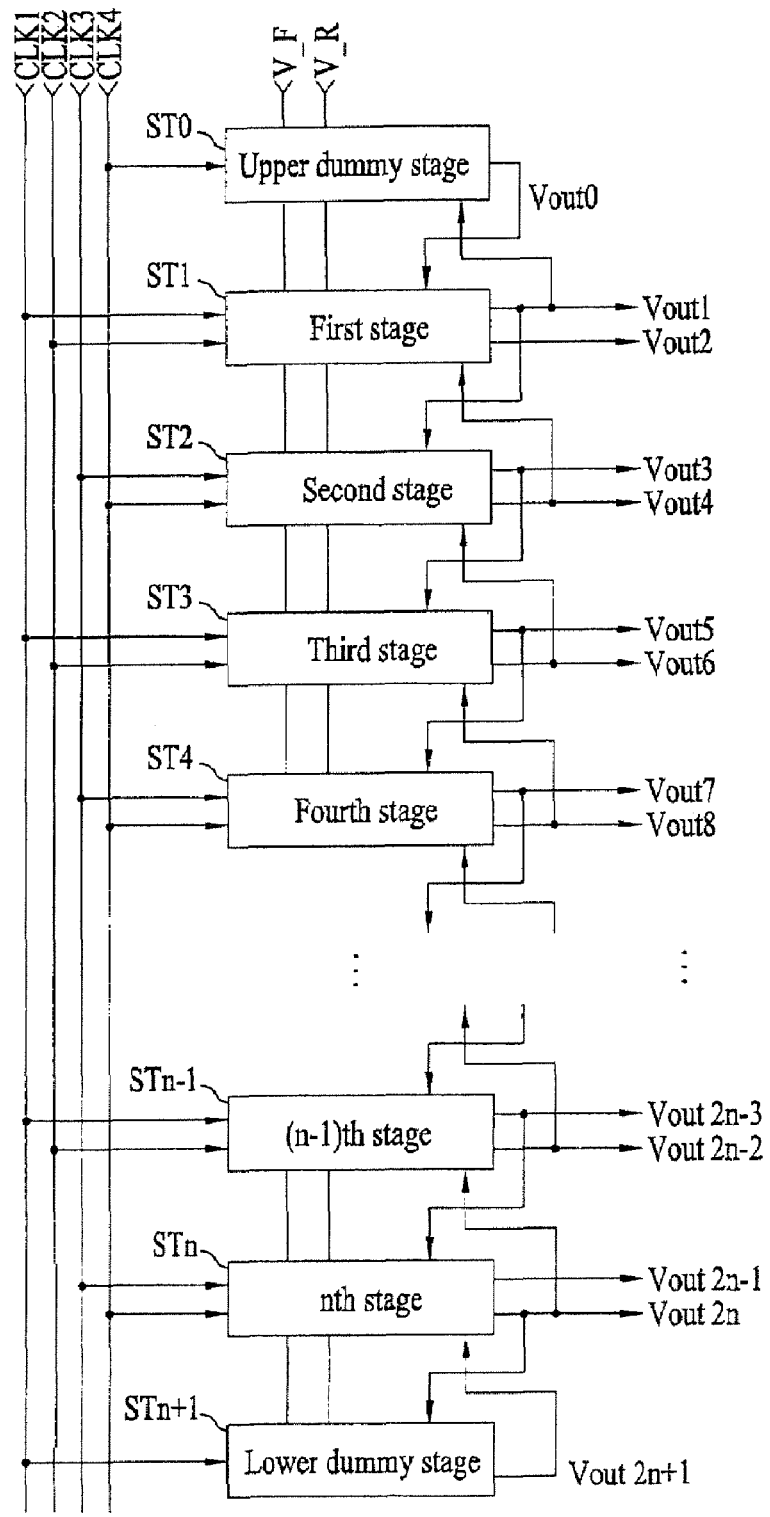
FIG. 1 is a block diagram showing the configuration of a shift register according to a first exemplary embodiment of the present invention.
Figure 2:
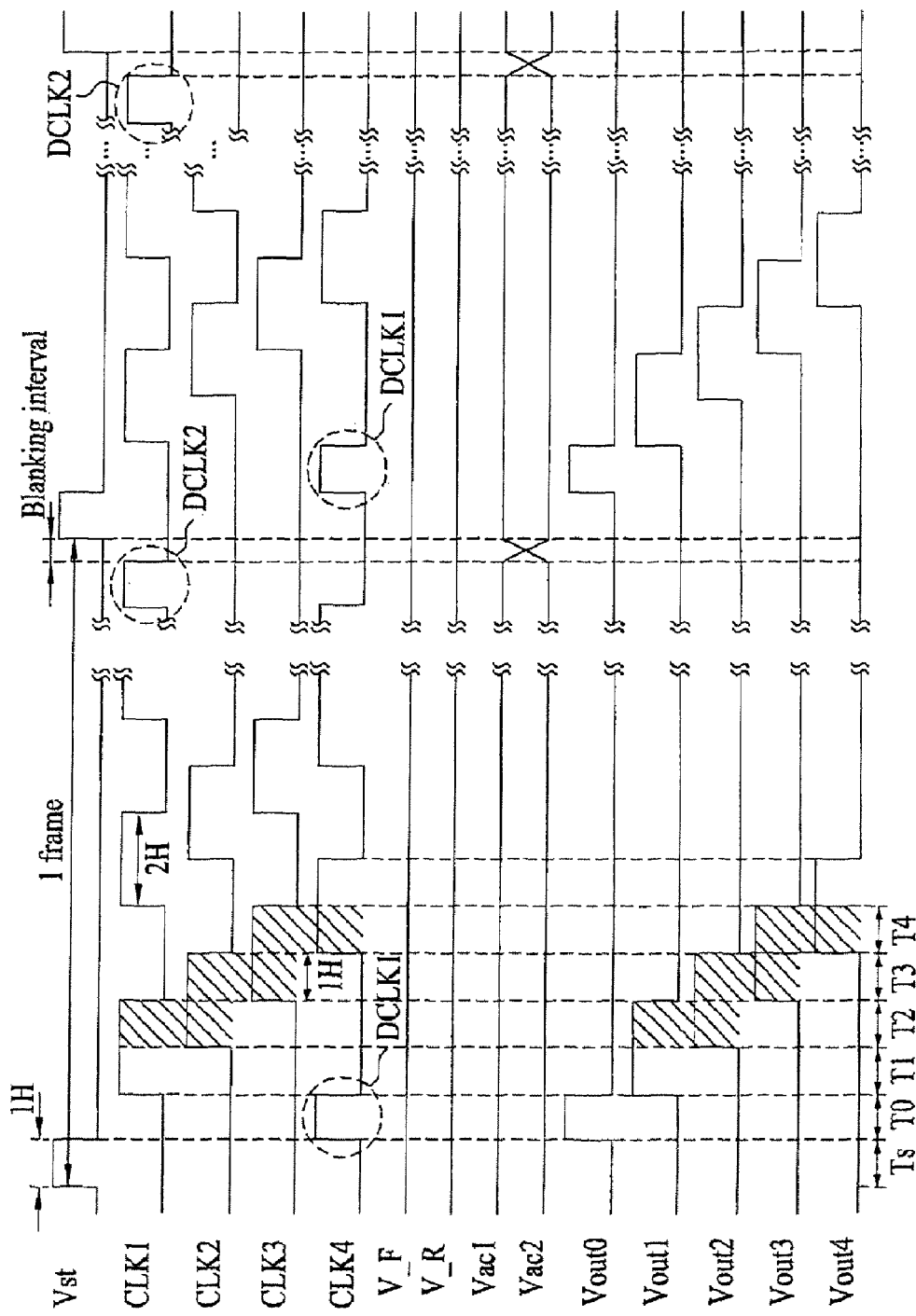
FIG. 2 is a timing diagram of exemplary signals supplied to the shift register of FIG. 1 in a forward driving mode.
Figure 3:
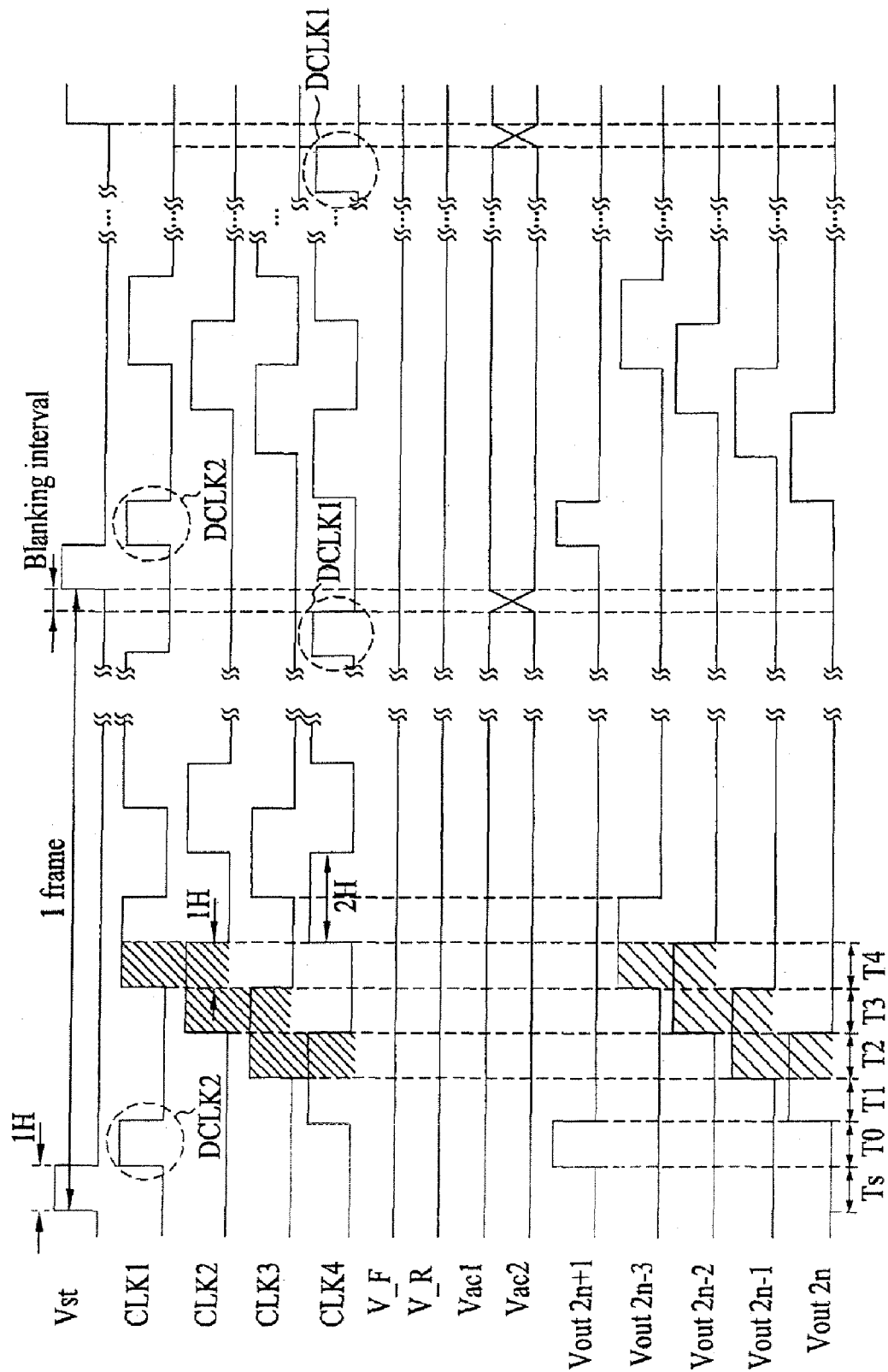
FIG. 3 is a timing diagram of exemplary signals supplied to the shift register of FIG. 1 in a reverse driving mode.

FIG. 1 is a block diagram showing the configuration of a shift register according to a first exemplary embodiment of the present invention. FIG. 2 is a timing diagram of various signals which are supplied to the shift register of FIG. 1 in forward driving. FIG. 3 is a timing diagram of various signals which are supplied to the shift register of FIG. 1 in reverse driving mode.

As shown in FIG. 1, the shift register according to the first exemplary embodiment of the present invention comprises n stages ST1 to STn and two dummy stages ST0 and STn+1. Each of the stages ST1 to STn outputs two scan pulses for one frame period. Each of the stages ST1 to STn drives gate lines connected thereto using the scan pulses and controls the operations of a stage downstream therefrom and a stage upstream therefrom using the scan pulses. All the stages ST0 to STn+1 including the upper dummy stage ST0 and lower dummy stage STn+1 output scan pulses Vout0 to Vout2n+1 in order.

At this time, each of the stages ST0 to STn+1 is driven in a forward direction or in a reverse direction depending on signal states of a forward voltage V_F and a reverse voltage V_R. First, in the forward driving mode, the stages ST0 to STn+1 output the scan pulses in order from the upper dummy stage ST0 to the lower dummy stage STn+1. That is, the upper dummy stage ST0 outputs an upper dummy scan pulse Vout0, the first stage ST1 then sequentially outputs first and second scan pulses Vout1 and Vout2, the second stage ST2 then sequentially outputs third and fourth scan pulses Vout3 and Vout4, the third stage ST3 then sequentially outputs fifth and sixth scan pulses Vout5 and Vout6, and so on until the nth stage STn then sequentially outputs (2n−1)th and (2n)th scan pulses Vout2n−1 and Vout2n, and the lower dummy stage STn+1 finally outputs a lower dummy scan pulse Vout2n+1.

In the reverse driving mode, the stages ST0 to STn+1 output the scan pulses in order from the lower dummy stage STn+1 to the upper dummy stage ST0. That is, the lower dummy stage STn+1 outputs a lower dummy scan pulse Vout2n+1, the nth stage STn then sequentially outputs (2n)th and (2n−1)th scan pulses Vout2n and Vout2n−1, the (n−1)th stage STn−1 then sequentially outputs (2n−2)th and (2n−3)th scan pulses Vout2n−2 and Vout2n−3, the (n−2)th stage then sequentially outputs (2n−4)th and (2n−5)th scan pulses, and so on until the first stage ST1 then sequentially outputs second and first scan pulses Vout2 and Vout1, and the upper dummy stage ST0 finally outputs an upper dummy scan pulse Vout0.

The scan pulses Vout1 to Vout2n output from the stages ST1 to STn, other than the upper and lower dummy stages ST0 and STn+1, are sequentially supplied to gate lines of a liquid crystal panel (not shown) to sequentially scan the gate lines.

This shift register may be built in the liquid crystal panel. That is, the liquid crystal panel has a display region for displaying an image, and a non-display region surrounding the display region, and the shift register is built in the non-display region. Each of the stages ST1 to STn provided in the shift register, configured in this manner, is supplied with two of first to fourth clock pulses CLK1 to CLK4 which are output sequentially out of phase with one another and cyclically, a charging voltage, first and second alternating current (AC) voltages Vac1 and Vac2, the forward voltage V_F, and the reverse voltage V_R, as shown in FIGS. 2 and 3. On the other hand, each of the upper and lower dummy stages ST0 and STn+1 is supplied with any one of the first to fourth clock pulses CLK1 to CLK4 which are output sequentially out of phase with one another and cyclically, a start pulse Vst, the charging voltage, a discharging voltage, the forward voltage V_F, and the reverse voltage V_R.

Both the charging voltage and the discharging voltage are direct current (DC) voltages. The charging voltage is positive, and the discharging voltage is negative. Alternatively, the discharging voltage may be a ground voltage. The first and second AC voltages Vac1 and Vac2 are signals for control of charging and discharging of reset nodes, among nodes of each stage ST1 to STn. Both the first AC voltage Vac1 and the second AC voltage Vac2 are AC voltages. The first AC voltage Vac1 is 180° phase-inverted with respect to the second AC voltage Vac2. The high state voltage values of the first and second AC voltages Vac1 and Vac2 may be the same as the voltage value of the charging voltage, and the low state voltage values of the first and second AC voltages Vac1 and Vac2 may be the same as the voltage value of the discharging voltage. The states of the first and second AC voltages Vac1 and Vac2 are inverted at intervals of a period of p frames. Here, p is a natural number.

The first to fourth clock pulses CLK1 to CLK4 are signals which are used to generate the scan pulses of the respective stages ST1 to STn. Each stage ST1 to STn receives two of the first to fourth clock pulses CLK1 to CLK4 and outputs two scan pulses. For example, each odd one of the stages outputs two scan pulses using the first and second clock pulses CLK1 and CLK2, and each even one of the stages outputs two scan pulses using the third and fourth clock pulses CLK3 and CLK4. Although the four types of clock pulses having different phases are used for illustrative purposes in the present invention, any number of types of clock pulses may be used as long as they are two or more. The first to fourth clock pulses CLK1 to CLK4 are output out of phase with one another. That is, the second clock pulse CLK2 is output after being phase-delayed from the first clock pulse CLK1, and the third clock pulse CLK3 is output after being phase-delayed from the second clock pulse CLK2. The fourth clock pulse CLK4 is output after being phase-delayed from the third clock pulse CLK3, and the first clock pulse CLK1 is output after being phase-delayed from the fourth clock pulse CLK4.

The first to fourth clock pulses CLK1 to CLK4 are output sequentially and cyclically. In other words, the first to fourth clock pulses CLK1 to CLK4 are output sequentially from the first clock pulse CLK1 to the fourth clock pulse CLK4 and, thereafter, again from the first clock pulse CLK1 to the fourth clock pulse CLK4. As a result, the first clock pulse CLK1 is output in a period between the fourth clock pulse CLK4 and the second clock pulse CLK2.

The start pulse Vst is output only once for one frame, whereas each of the clock pulses CLK1 to CLK4 is output several times for one frame period. In other words, the start pulse Vst exhibits its active state (high state) only once for one frame period, whereas each of the clock pulses CLK1 to CLK4 exhibits its active state periodically several times for one frame period. This start pulse Vst is output earlier than any clock pulses CLK1 to CLK4 in one frame period.

In the forward driving mode, the clock pulses CLK1 to CLK4 are output in order from the first clock pulse CLK1 to the fourth clock pulse CLK4, as shown in FIG. 2. In contrast, in the reverse driving mode, the clock pulses CLK1 to CLK4 are output in order from the fourth clock pulse CLK4 to the first clock pulse CLK1, as shown in FIG. 3.

In the present invention, the first to fourth clock pulses CLK1 to CLK4 have pulse widths overlapping with one another, as shown in FIGS. 2 and 3. That is, as shown in FIG. 2, the first half of the pulse width of an ith clock pulse (where i is a natural number which is greater than or equal to 2) overlaps with the second half of the pulse width of an (i−1)th clock pulse, and the second half of the pulse width of the ith clock pulse overlaps with the first half of the pulse width of an (i+1)th clock pulse. Also, as shown in FIG. 3, the first half of the pulse width of an ith clock pulse overlaps with the second half of the pulse width of an (i+1)th clock pulse, and the second half of the pulse width of the ith clock pulse overlaps with the first half of the pulse width of an (i−1)th clock pulse. For example, provided that each of the first to fourth clock pulses CLK1 to CLK4 has a pulse width corresponding to a 2-horizontal time 2H, the adjacent clock pulses may overlap with each other by a period corresponding to a 1-horizontal time 1H, as shown in FIGS. 2 and 3. The pulse width overlap period is not limited to the half pulse width, and is adjustable to any period. Using the clock pulses CLK1 to CLK4 overlapping in this manner, the pulse widths of the scan pulses output from the respective stages ST1 to STn also overlap with one another.

In the forward driving mode, a first dummy clock pulse DCLK1 is output in a period between the output period of the start pulse Vst and the output period of the first clock pulse CLK1, as shown in FIG. 2. The first dummy clock pulse DCLK1 is a signal which is used as the scan pulse of the upper dummy stage ST0, and is output only once for one frame period. This first dummy clock pulse DCLK1 is output together with the fourth clock pulse CLK4 through a clock transfer line which transfers the fourth clock pulse CLK4. Also, in the forward driving mode, as shown in FIG. 2, a second dummy clock pulse DCLK2 is output in a period between the output period of the fourth clock pulse CLK4 and the output period of the start pulse Vst in a next frame period. In other words, the second dummy clock pulse DCLK2 is output immediately before a blanking interval of one frame. The second dummy clock pulse DCLK2 is a signal which is used as the scan pulse of the lower dummy stage STn+1, and is output only once for one frame period. This second dummy clock pulse DCLK2 is output together with the first clock pulse CLK1 through a clock transfer line which transfers the first clock pulse CLK1.

In the reverse driving mode, the output order of the first to fourth clock pulses CLK1 to CLK4 is changed as shown in FIG. 3. As a result, a second dummy clock pulse DCLK2 is output in a period between the output period of the start pulse Vst and the output period of the fourth clock pulse CLK4. The second dummy clock pulse DCLK2 is a signal which is used as the scan pulse of the lower dummy stage STn+1, and is output only once for one frame period. This second dummy clock pulse DCLK2 is output together with the first clock pulse CLK1 through the clock transfer line which transfers the first clock pulse CLK1, as stated above. Also, in the reverse driving mode, as shown in FIG. 3, a first dummy clock pulse DCLK1 is output in a period between the output period of the first clock pulse CLK1 and the output period of the start pulse Vst in a next frame period due to the change in the output order of the first to fourth clock pulses CLK1 to CLK4. In other words, the first dummy clock pulse DCLK1 is output immediately before a blanking interval of one frame. The first dummy clock pulse DCLK1 is a signal which is used as the scan pulse of the upper dummy stage ST0, and is output only once for one frame period. This first dummy clock pulse DCLK1 is output together with the fourth clock pulse CLK4 through the clock transfer line which transfers the fourth clock pulse CLK4, as stated above.

The upper and lower dummy stages ST0 and STn+1 and the stages ST1 to STn shown in FIG. 1 are supplied and operated with the various signals having the above-stated characteristics. Each stage ST1 to STn must first be enabled to output the scan pulses. Each stage being enabled means that each stage is set to an output enable state. That is, a state capable of outputting the clock pulses supplied thereto as the scan pulses.

In the forward driving mode, each stage ST1 to STn is enabled in response to an earlier output one of two scan pulses from a stage upstream therefrom. For example, a jth stage is enabled in response to an earlier output one of two scan pulses from a (j−1)th stage. However, in the forward driving mode, the top stage, or first stage ST1, is enabled in response to the upper dummy scan pulse Vout0 from the upper dummy stage ST0. The upper dummy stage ST0 is enabled in response to the start pulse Vst from a start transfer line.

In contrast, in the reverse driving mode, each stage ST1 to STn is enabled in response to an earlier output one of two scan pulses from a stage downstream therefrom. For example, a jth stage is enabled in response to an earlier output one of two scan pulses from a (j+1)th stage. However, in the reverse driving mode, the bottom stage, or nth stage STn, is enabled in response to the lower dummy scan pulse Vout2n+1 from the lower dummy stage STn+1. The lower dummy stage STn+1 is enabled in response to the start pulse Vst from the start transfer line.

On the other hand, each stage ST1 to STn is disabled after outputting the scan pulses. Each stage being disabled means that each stage is reset to an output disable state. That is, a state incapable of outputting the clock pulses supplied thereto as the scan pulses.

In the forward driving mode, each stage ST1 to STn is disabled in response to a later output one of two scan pulses from a stage downstream therefrom. For example, a jth stage is disabled in response to a later output one of two scan pulses from a (j+1)th stage. However, in the forward driving mode, the bottom stage, or nth stage STn, is disabled in response to the lower dummy scan pulse Vout2n+1 from the lower dummy stage STn+1. The lower dummy stage STn+1 is disabled in response to the start pulse Vst from the start transfer line.

In contrast, in the reverse driving mode, each stage ST1 to STn is disabled in response to a later output one of two scan pulses from a stage upstream therefrom. For example, a jth stage is disabled in response to a later output one of two scan pulses from a (j−1)th stage. However, in the reverse driving mode, the top stage, or first stage ST1, is disabled in response to the upper dummy scan pulse Vout0 from the upper dummy stage ST0. The upper dummy stage ST0 is disabled in response to the start pulse Vst from the start transfer line.

Figure 4:
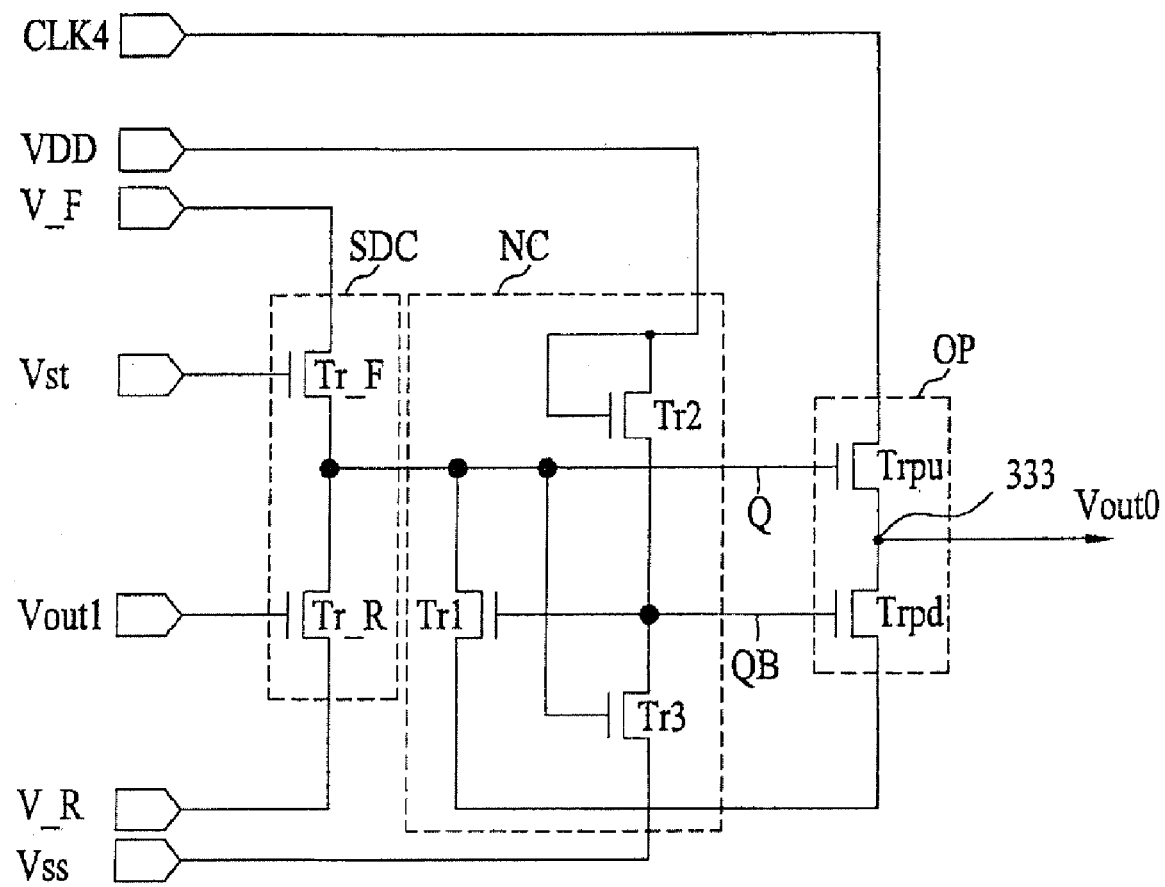
FIG. 4 is a circuit diagram of an upper dummy stage in FIG. 1.

The configuration of each of the stages ST1 to STn of the shift register, configured in this manner, including the upper and lower dummy stages ST0 and STn+1, will hereinafter be described in more detail. FIG. 4 is a circuit diagram of the upper dummy stage ST0 in FIG. 1.

The upper dummy stage ST0 includes a node controller NC, an output unit OP, and a scan direction controller SDC, as shown in FIG. 4. The node controller NC includes first to third switching devices Tr1 to Tr3. The first switching device Tr1 is turned on/off according to a signal state of a reset node QB and is connected between a set node Q and a discharging voltage line which transfers a discharging voltage VSS. To this end, the first switching device Tr1 has a gate terminal connected to the reset node QB, a drain terminal connected to the set node Q, and a source terminal connected to the discharging voltage line. The second switching device Tr2 is turned on/off according to a charging voltage VDD from a charging voltage line, and is connected between the charging voltage line and the reset node QB. To this end, the second switching device Tr2 has a gate terminal and a drain terminal connected to the charging voltage line, and a source terminal connected to the reset node QB. The third switch Tr3 is turned on/off according to a signal state of the set node Q, and is connected between the reset node and the discharging voltage line. To this end, the third switching device Tr3 has a gate terminal connected to the set node Q, a drain terminal connected to the reset node QB, and a source terminal connected to the discharging voltage line.

The output unit OP includes a pull-up switching device Trpu and a pull-down switching device Trpd. The pull-up switching device Trpu is turned on/off according to the signal state of the set node Q, and is connected between any one of the clock transfer lines which transfer the clock pulses CLK1 to CLK4 and an output terminal 333. To this end, the pull-up switching device Trpu has a gate terminal connected to the set node Q, a drain terminal connected to any one of the clock transfer lines, and a source terminal connected to the output terminal 333. Here, the drain terminal of the pull-up switching device Trpu is connected to the clock transfer line which transfers the fourth clock pulse CLK4.

The scan direction controller SDC includes a forward switching device Tr_F and a reverse switching device Tr_R. The forward switching device Tr_F is turned on/off in response to the start pulse Vst from the start transfer line, and is connected between a forward voltage line which transfers the forward voltage V_F and the set node Q. To this end, the forward switching device Tr_F has a gate terminal connected to the start transfer line, a drain terminal connected to the forward voltage line, and a source terminal connected to the set node Q.

The reverse switching device Tr_R is turned on/off in response to the first scan pulse Vout1 from the first stage ST1, and is connected between the set node Q and a reverse voltage line which transfers the reverse voltage V_R. To this end, the reverse switching device Tr_R has a gate terminal connected to any one of two output terminals of the first stage ST1, a drain terminal connected to the set node Q, and a source terminal connected to the reverse voltage line.

Figure 5:
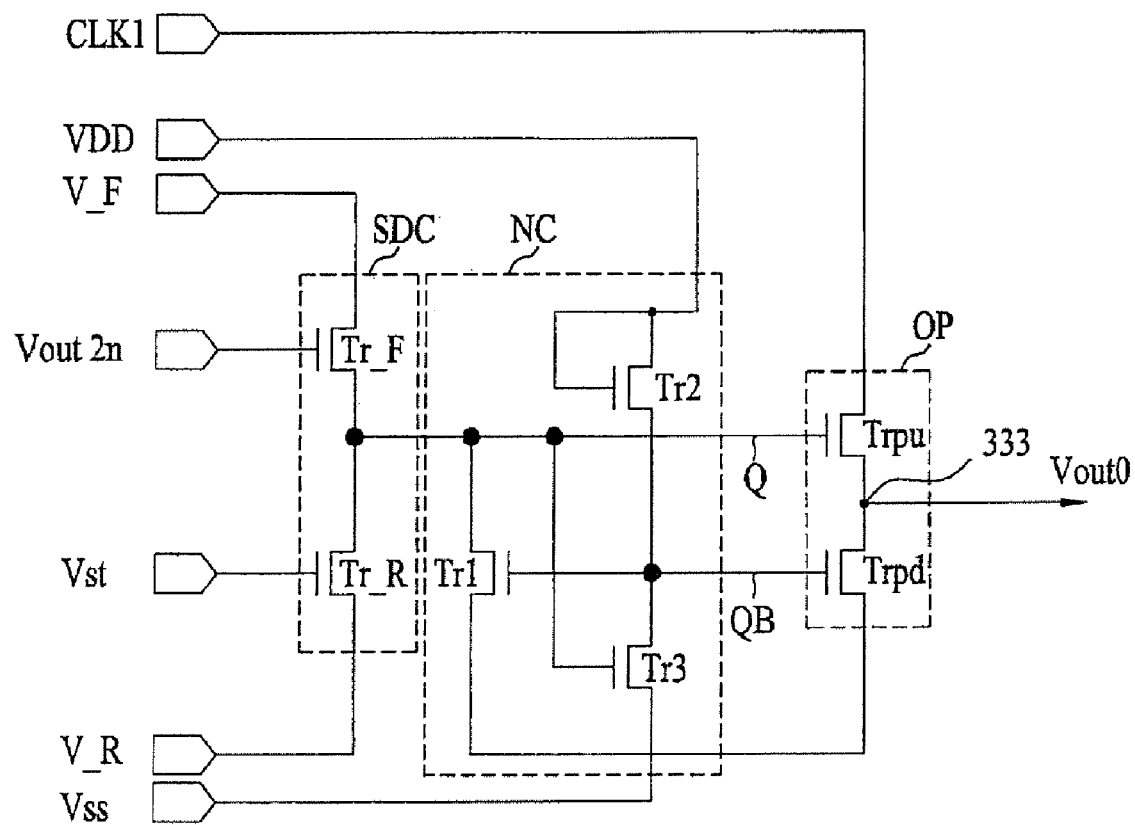
FIG. 5 is a circuit diagram of a lower dummy stage in FIG. 1.

FIG. 5 is a circuit diagram of the lower dummy stage STn+1 in FIG. 1. The lower dummy stage STn+1 includes a node controller NC, an output unit OP, and a scan direction controller SDC, as shown in FIG. 5. The node controller NC includes first to third switching devices Tr1 to Tr3. The first switching device Tr1 is turned on/off according to a signal state of a reset node QB and is connected between a set node Q and the discharging voltage line which transfers the discharging voltage VSS. To this end, the first switching device Tr1 has a gate terminal connected to the reset node QB, a drain terminal connected to the set node Q, and a source terminal connected to the discharging voltage line. The second switching device Tr2 is turned on/off according to the charging voltage VDD from the charging voltage line, and is connected between the charging voltage line and the reset node QB. To this end, the second switching device Tr2 has a gate terminal and a drain terminal connected to the charging voltage line, and a source terminal connected to the reset node QB. The third switch Tr3 is turned on/off according to a signal state of the set node Q, and is connected between the reset node QB and the discharging voltage line. To this end, the third switching device Tr3 has a gate terminal connected to the set node Q, a drain terminal connected to the reset node QB, and a source terminal connected to the discharging voltage line.

The output unit OP includes a pull-up switching device Trpu and a pull-down switching device Trpd. The pull-up switching device Trpu is turned on/off according to the signal state of the set node Q, and is connected between any one of the clock transfer lines which transfer the clock pulses CLK1 to CLK4 and an output terminal 333. To this end, the pull-up switching device Trpu has a gate terminal connected to the set node Q, a drain terminal connected to any one of the clock transfer lines, and a source terminal connected to the output terminal 333. Here, the drain terminal of the pull-up switching device Trpu is connected to the clock transfer line which transfers the first clock pulse CLK1.

The scan direction controller SDC includes a forward switching device Tr_F and a reverse switching device Tr_R. The forward switching device Tr_F is turned on/off in response to any one of the two scan pulses from the nth stage STn, and is connected between the forward voltage line which transfers the forward voltage V_F and the set node Q. To this end, the forward switching device Tr_F has a gate terminal connected to any one of two output terminals of the nth stage, a drain terminal connected to the forward voltage line, and a source terminal connected to the set node Q.

The reverse switching device Tr_R is turned on/off in response to the start pulse Vst from the start transfer line, and is connected between the set node Q and the reverse voltage line which transfers the reverse voltage V_R. To this end, the reverse switching device Tr_R has a gate terminal connected to the start transfer line, a drain terminal connected to the set node Q, and a source terminal connected to the reverse voltage line.

Figure 6:
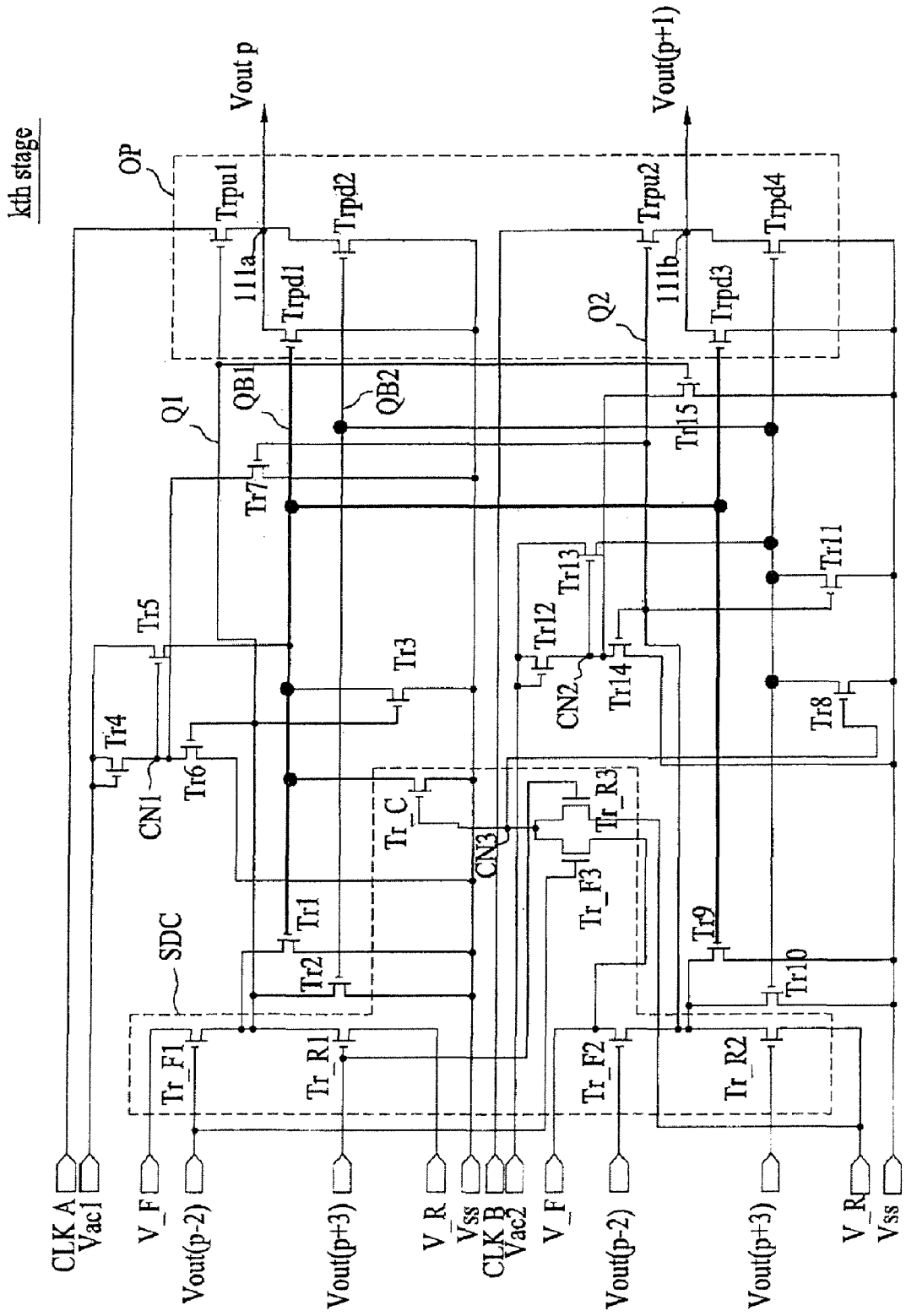
FIG. 6 is a circuit diagram of each stage in FIG. 1.

FIG. 6 is a circuit diagram of each stage ST1 to STn in FIG. 1. Each stage ST1 to STn includes a node controller, a scan direction controller SDC, and an output unit OP, as shown in FIG. 6. The node controller controls signal states of a first set node Q1, second set node Q2, first reset node QB1 and second reset node QB2. The node controller of a kth stage includes first to fifteenth switching devices Tr1 to Tr15.

The first switching device Tr1 in the kth stage is turned on/off according to a signal state of the first reset node QB1, and is connected between the first set node Q1 and the discharging voltage line. To this end, the first switching device Tr1 in the kth stage has a gate terminal connected to the first reset node QB1, a drain terminal connected to the first set node Q1, and a source terminal connected to the discharging voltage line.

The second switching device Tr2 in the kth stage is turned on/off according to a signal state of the second reset node QB2, and is connected between the first set node Q1 and the discharging voltage line. To this end, the second switching device Tr2 in the kth stage has a gate terminal connected to the second reset node QB2, a drain terminal connected to the first set node Q1, and a source terminal connected to the discharging voltage line.

The third switching device Tr3 in the kth stage is turned on/off according to a signal state of the first set node Q1, and is connected between the first reset node QB1 and the discharging voltage line. To this end, the third switching device Tr3 in the kth stage has a gate terminal connected to the first set node Q1, a drain terminal connected to the first reset node QB1, and a source terminal connected to the discharging voltage line.

The fourth switching device Tr4 in the kth stage is turned on/off according to the first AC voltage Vac1 from a first AC voltage line, and is connected between the first AC voltage line and a first common node CN1. To this end, the fourth switching device Tr4 in the kth stage has a gate terminal and a drain terminal connected to the first AC voltage line, and a source terminal connected to the first common node CN1.

The fifth switching device Tr5 in the kth stage is turned on/off according to a signal state of the first common node CN1, and is connected between the first AC voltage line and the first reset node QB1. To this end, the fifth switching device Tr5 in the kth stage has a gate terminal connected to the first common node CN1, a drain terminal connected to the first AC voltage line, and a source terminal connected to the first reset node QB1.

The sixth switching device Tr6 in the kth stage is turned on/off according to the signal state of the first set node Q1, and is connected between the first common node CN1 and the discharging voltage line. To this end, the sixth switching device Tr6 in the kth stage has a gate terminal connected to the first set node Q1, a drain terminal connected to the first common node CN1, and a source terminal connected to the discharging voltage line.

The seventh switching device Tr7 in the kth stage is turned on/off according to a signal state of the second set node Q2, and is connected between the first common node CN1 and the discharging voltage line. To this end, the seventh switching device Tr7 in the kth stage has a gate terminal connected to the second set node Q2, a drain terminal connected to the first common node CN1, and a source terminal connected to the discharging voltage line.

The eighth switching device Tr8 in the kth stage is turned on/off in response to an output signal from the scan direction controller SDC, and is connected between the second reset node QB2 and the discharging voltage line. To this end, the eighth switching device Tr8 in the kth stage has a gate terminal connected to an output terminal of the scan direction controller SDC, a drain terminal connected to the second reset node QB2, and a source terminal connected to the discharging voltage line.

The ninth switching device Tr9 in the kth stage is turned on/off according to the signal state of the first reset node QB1, and is connected between the second set node Q2 and the discharging voltage line. To this end, the ninth switching device Tr9 in the kth stage has a gate terminal connected to the first reset node QB1, a drain terminal connected to the second set node Q2, and a source terminal connected to the discharging voltage line.

The tenth switching device Tr10 in the kth stage is turned on/off according to the signal state of the second reset node QB2, and is connected between the second set node Q2 and the discharging voltage line. To this end, the tenth switching device Tr10 in the kth stage has a gate terminal connected to the second reset node QB2, a drain terminal connected to the second set node Q2, and a source terminal connected to the discharging voltage line.

The eleventh switching device Tr11 in the kth stage is turned on/off according to the signal state of the second set node Q2, and is connected between the second reset node QB2 and the discharging voltage line. To this end, the eleventh switching device Tr11 in the kth stage has a gate terminal connected to the second set node Q2, a drain terminal connected to the second reset node QB2, and a source terminal connected to the discharging voltage line.

The twelfth switching device Tr12 in the kth stage is turned on/off according to the second AC voltage Vac2 from a second AC voltage line, and is connected between the second AC voltage line and a second common node CN2. To this end, the twelfth switching device Tr12 in the kth stage has a gate terminal and a drain terminal connected to the second AC voltage line, and a source terminal connected to the second common node CN2.

The thirteenth switching device Tr13 in the kth stage is turned on/off according to a signal state of the second common node CN2, and is connected between the second AC voltage line and the second reset node QB2. To this end, the thirteenth switching device Tr13 in the kth stage has a gate terminal connected to the second common node CN2, a drain terminal connected to the second AC voltage line, and a source terminal connected to the second reset node QB2.

The fourteenth switching device Tr14 in the kth stage is turned on/off according to the signal state of the second set node Q2, and is connected between the second common node CN2 and the discharging voltage line. To this end, the fourteenth switching device Tr14 in the kth stage has a gate terminal connected to the second set node Q2, a drain terminal connected to the second common node CN2, and a source terminal connected to the discharging voltage line.

The fifteenth switching device Tr15 in the kth stage is turned on/off according to the signal state of the first set node Q1, and is connected between the second common node CN2 and the discharging voltage line. To this end, the fifteenth switching device Tr15 in the kth stage has a gate terminal connected to the first set node Q1, a drain terminal connected to the second common node CN2, and a source terminal connected to the discharging voltage line.

The scan direction controller SDC includes first to third forward switching devices Tr_F1 to Tr_F3, first to third reverse switching devices Tr_R1 to Tr_R3, and a control switching device Tr_C. The first forward switching device Tr_F1 in the kth stage is turned on/off in response to an earlier output one of two scan pulses from a (k−1)th stage, and is connected between the forward voltage line and the first set node Q1. To this end, the first forward switching device Tr_F1 in the kth stage has a gate terminal connected to a first output terminal 111a of the (k−1)th stage, a drain terminal connected to the forward voltage line, and a source terminal connected to the first set node Q1. Notably, the gate terminal of the first forward switching device Tr_F1 in the first stage ST1 is connected to the output terminal of the upper dummy stage ST0.

The first reverse switching device Tr_R1 in the kth stage is turned on/off in response to a later output one of two scan pulses from a (k+1)th stage, and is connected between the first set node Q1 and the reverse voltage line. To this end, the first reverse switching device Tr_R1 in the kth stage has a gate terminal connected to a second output terminal 111b of the (k+1)th stage, a drain terminal connected to the first set node Q1, and a source terminal connected to the reverse voltage line.

The second forward switching device Tr_F2 in the kth stage is turned on/off in response to the earlier output one of the two scan pulses from the (k−1)th stage, and is connected between the forward voltage line and the second set node Q2. To this end, the second forward switching device Tr_F2 in the kth stage has a gate terminal connected to the first output terminal 111a of the (k−1)th stage, a drain terminal connected to the forward voltage line, and a source terminal connected to the second set node Q2. Notably, the gate terminal of the second forward switching device Tr_F2 in the first stage ST1 is connected to the output terminal of the upper dummy stage ST0.

The second reverse switching device Tr_R2 in the kth stage is turned on/off in response to the later output one of the two scan pulses from the (k+1)th stage, and is connected between the second set node Q2 and the reverse voltage line. To this end, the second reverse switching device Tr_R2 in the kth stage has a gate terminal connected to the second output terminal 111b of the (k+1)th stage, a drain terminal connected to the second set node Q2, and a source terminal connected to the reverse voltage line.

The third forward switching device Tr_F3 in the kth stage is turned on/off in response to the earlier output one of the two scan pulses from the (k−1)th stage, and is connected between a third common node CN3 and the forward voltage line. To this end, the third forward switching device Tr_F3 has a gate terminal connected to the first output terminal 111a of the (k−1)th stage, a drain terminal connected to the third common node CN3, and a source terminal connected to the forward voltage line.

The third reverse switching device Tr_R3 in the kth stage is turned on/off in response to the later output one of the two scan pulses from the (k+1)th stage, and is connected between the reverse voltage line and the third common node CN3. To this end, the third reverse switching device Tr_R3 has a gate terminal connected to the second output terminal 111b of the (k+1)th stage, a drain terminal connected to the reverse voltage line, and a source terminal connected to the third common node CN3.

The control switching device Tr_C in the kth stage is controlled according to a signal state of the third common node CN3, and is connected between the first reset node QB1 and the discharging voltage line. To this end, the control switching device Tr_C in the kth stage has a gate terminal connected to the third common node CN3, a drain terminal connected to the first reset node QB1, and a source terminal connected to the discharging voltage line. On the other hand, the gate terminal of the eighth switching device Tr8 in the kth stage is connected to the third common node CN3.

The output unit OP includes first and second pull-up switching devices Trpu1 and Trpu2 and first to fourth pull-down switching devices Trpd1 to Trpd4. The first pull-up switching device Trpu1 is turned on/off according to the signal state of the first set node Q1, and is connected between any one of the clock transfer lines which transfer the clock pulses CLK1 to CLK4 and the first output terminal 111a. To this end, the first pull-up switching device Trpu1 has a gate terminal connected to the first set node Q1, a drain terminal connected to any one of the clock transfer lines, and a source terminal connected to the first output terminal 111a.

The second pull-up switching device Trpu2 is turned on/off according to the signal state of the second set node Q2, and is connected between any one of the clock transfer lines which transfer the clock pulses CLK1 to CLK4 and the second output terminal 111b. To this end, the second pull-up switching device Trpu2 has a gate terminal connected to the second set node Q2, a drain terminal connected to any one of the clock transfer lines, and a source terminal connected to the second output terminal 111b. Here, the drain terminal of the first pull-up switching device Trpu1 and the drain terminal of the second pull-up switching device Trpu2 are connected to different clock transfer lines.

The first pull-down switching device Trpd1 is turned on/off according to the signal state of the first reset node QB1, and is connected between the first output terminal 111a and the discharging voltage line. To this end, the first pull-down switching device Trpd1 has a gate terminal connected to the first reset node QB1, a drain terminal connected to the first output terminal 111a, and a source terminal connected to the discharging voltage line.

The second pull-down switching device Trpd2 is turned on/off according to the signal state of the second reset node QB2, and is connected between the first output terminal 111a and the discharging voltage line. To this end, the second pull-down switching device Trpd2 has a gate terminal connected to the second reset node QB2, a drain terminal connected to the first output terminal 111a, and a source terminal connected to the discharging voltage line.

The third pull-down switching device Trpd3 is turned on/off according to the signal state of the first reset node QB1, and is connected between the second output terminal 111b and the discharging voltage line. To this end, the third pull-down switching device Trpd3 has a gate terminal connected to the first reset node QB1, a drain terminal connected to the second output terminal 111b, and a source terminal connected to the discharging voltage line.

The fourth pull-down switching device Trpd4 is turned on/off according to the signal state of the second reset node QB2, and is connected between the second output terminal 111b and the discharging voltage line. To this end, the fourth pull-down switching device Trpd4 has a gate terminal connected to the second reset node QB2, a drain terminal connected to the second output terminal 111b, and a source terminal connected to the discharging voltage line.

The operation of the shift register with the above-stated configuration will hereinafter be described. A description will first be given of the operation of the shift register based on the forward driving mode with reference to FIGS. 2, 4, 5 and 6.

Because the operation of the shift register is based on the forward driving mode, the clock pulses CLK1 to CLK4 are output in order from the first clock pulse CLK1 to the fourth clock pulse CLK4, the forward voltage V_F is in the high state, and the reverse voltage V_R is in the low state, as shown in FIG. 2. First, a description will be given of an operation in a first initial period Ts of a first frame period.

In the first frame period, the first AC voltage Vac1 is positive and the second AC voltage Vac2 is negative. In the first initial period Ts, only the start pulse Vst, output from a timing controller, is maintained in the high state and the clock pulses CLK1 to CLK4, output from the timing controller, are maintained in the low state, as shown in FIG. 2.

The start pulse Vst output from the timing controller is supplied to the upper dummy stage ST0 and the lower dummy stage STn+1. That is, as shown in FIG. 4, the start pulse Vst is supplied to the gate terminal of the forward switching device Tr_F in the upper dummy stage ST0. As a result, the forward switching device Tr_F is turned on and the forward voltage V_F of the high state is supplied to the set node Q through the turned-on forward switching device Tr_F. Consequently, the set node Q is charged and the pull-up switching device Trpu and the third switching device Tr3, connected to the charged set node Q through the gate terminals thereof, are thus turned on.

The discharging voltage VSS is supplied to the reset node QB through the turned-on third switching device Tr3. On the other hand, because the second switching device Tr2 is always kept turned on by the charging voltage VDD, which is a DC voltage of the high state, the charging voltage VDD is supplied to the reset node QB through the second switching device Tr2. As a result, the charging voltage VDD of the high state output through the second switching device Tr2 and the discharging voltage VSS of the low state output through the third switching device Tr3 are together supplied to the reset node QB. At this time, because the size of the third switching device Tr3 is set to be larger than that of the second switching device Tr2, the reset node QB is discharged by the discharging voltage VSS of the low state supplied through the third switching device Tr3. Thus, the pull-down switching device Trpd and the first switching device Tr1, connected to the discharged reset node QB through the gate terminals thereof, are turned off.

On the other hand, because there is no output from the first stage ST1 in the first initial period Ts, the reverse switching device Tr_R in the upper dummy stage ST0 remains turned off. In this manner, in the first initial period Ts, the upper dummy stage ST0 is set. Meanwhile, in the first initial period Ts, the lower dummy stage STn+1 supplied with the start pulse Vst is reset, which will hereinafter be described in more detail. That is, as shown in FIG. 5, the start pulse Vst is supplied to the gate terminal of the reverse switching device Tr_R in the lower dummy stage STn+1. As a result, the reverse switching device Tr_R is turned on and the reverse voltage V_R of the low state is supplied to the set node Q through the turned-on reverse switching device Tr_R. Consequently, the set node Q is discharged and the pull-up switching device Trpu and the third switching device Tr3, connected to the discharged set node Q through the gate terminals thereof, are thus turned off. Because the second switching device Tr2 is always kept turned on by the charging voltage VDD, which is a DC voltage of the high state, the charging voltage VDD is supplied to the reset node QB through the second switching device Tr2. As a result, the reset node QB is charged and the pull-down switching device Trpd and the first switching device Tr1, connected to the charged reset node QB through the gate terminals thereof, are thus turned on.

The turned-on first switching device Tr1 supplies the discharging voltage VSS to the set node Q such that the set node Q is more stably maintained in its discharged state. Also, the turned-on first switching device Tr1 supplies the discharging voltage VSS to the nth stage STn. In this manner, in the first initial period Ts, the lower dummy stage STn+1 is reset.

Next, a description will be given of an operation in a second initial period T0. In the second initial period T0, only the first dummy clock pulse DCLK1 is maintained in the high state, and the start pulse Vst and all the clock pulses CLK1 to CLK4 are maintained in the low state. In the second initial period T0, the start pulse Vst goes from the high state to the low state and the forward switching device Tr_F in the upper dummy stage ST0 is thus turned off, thereby causing the set node Q in the upper dummy stage ST0 to float. As a result, the charging voltage VDD supplied to the set node Q in the upper dummy stage ST0 in the first initial period Ts is maintained at the set node Q even in the second initial period T0 as it is.

As the set node Q in the upper dummy stage ST0 is kept charged by the charging voltage VDD applied in the first initial period Ts, the pull-up switching device Trpu and third switching device Tr3 in the upper dummy stage ST0 are kept turned on. At this time, as the first dummy clock pulse DCLK1 is applied to the drain terminal of the turned-on pull-up switching device Trpu, the charging voltage VDD charged at the floating set node Q in the upper dummy stage ST0 is amplified by bootstrapping.

Accordingly, the first dummy clock pulse DCLK1 applied to the drain terminal of the pull-up switching device Trpu in the upper dummy stage ST0 is stably output through the source terminal (output terminal) of the pull-up switching device Trpu. This first dummy clock pulse DCLK1 output through the pull-up switching device Trpu is the upper dummy scan pulse Vout0. The upper dummy scan pulse Vout0 is supplied to the first stage ST1 to act to enable the first stage ST1. That is, the upper dummy scan pulse Vout0 output from the upper dummy stage ST0 is supplied to each of the gate terminals of the first forward switching device Tr_F1, third forward switching device Tr_F3 and second forward switching device Tr_F2 in the first stage ST1.

Then, the first forward switching device Tr_F1, third forward switching device Tr_F3 and second forward switching device Tr_F2 are turned on, thereby causing the forward voltage V_F of the high state to be applied to the first set node Q1 through the turned-on first forward switching device Tr_F1. As a result, the first set node Q1 is charged and the first pull-up switching device Trpu1, third switching device Tr3, sixth switching device Tr6 and fifteenth switching device Tr15, connected to the charged first set node Q1 through the gate terminals thereof, are thus turned on. The discharging voltage VSS is supplied to the first reset node QB1 through the turned-on third switching device Tr3, so that the first reset node QB1 is discharged. As a result, the first pull-down switching device Trpd1, first switching device Tr1, third pull-down switching device Trpd3 and ninth switching device Tr9, connected to the first reset node QB1 through the gate terminals thereof, are turned off.

On the other hand, because the first AC voltage Vac1 is maintained in the high state for the first frame period, the fourth switching device Tr4 supplied with the first AC voltage Vac1 is kept turned on for the first frame period. The first AC voltage Vac1 is supplied to the first common node CN1 of the first stage ST1 through the turned-on fourth switching device Tr4. At this time, the discharging voltage VSS output through the turned-on sixth switching device Tr6 is also supplied to the first common node CN1. That is, the first AC voltage Vac1 of the high state and the discharging voltage VSS of the low state are together supplied to the first common node CN1.

Notably, because the size of the sixth switching device Tr6 supplying the discharging voltage VSS is set to be larger than that of the fourth switching device Tr4 supplying the first AC voltage Vac1, the discharging voltage VSS is maintained at the first common node CN1. On the other hand, the discharging voltage VSS output through the turned-on seventh switching device Tr7 is further supplied to the first common node CN1, as will be described later. As a result, the first common node CN1 is discharged and the fifth switching device Tr5, connected to the discharged first common node CN1 through the gate terminal thereof, is thus turned off.

On the other hand, in the second initial period T0, the forward voltage V_F of the high state is applied to the second set node Q2 through the turned-on second forward switching device Tr_F2. As a result, the second set node Q2 is charged and the second pull-up switching device Trpu2, eleventh switching device Tr11, fourteenth switching device Tr14 and seventh switching device Tr7, connected to the charged second set node Q2 through the gate terminals thereof, are thus turned on. The discharging voltage VSS is supplied to the second reset node QB2 through the turned-on eleventh switching device Tr11, so that the second reset node QB2 is discharged. As a result, the fourth pull-down switching device Trpd4, tenth switching device Tr10, second pull-down switching device Trpd2 and second switching device Tr2, connected to the second reset node QB2 through the gate terminals thereof, are turned off.

On the other hand, because the second AC voltage Vac2 is maintained in the low state for the first frame period, the twelfth switching device Tr12 supplied with the second AC voltage Vac2 is kept turned off for the first frame period. The discharging voltage VSS output through the turned-on fifteenth switching device Tr15 is supplied to the second common node CN2. As a result, the second common node CN2 is discharged and the thirteenth switching device Tr13, connected to the discharged second common node CN2 through the gate terminal thereof, is turned off.

On the other hand, in the second initial period T0, the forward voltage V_F of the high state is applied to the third common node CN3 through the turned-on third forward switching device Tr_F3. As a result, the third common node CN3 is charged and the control switching device Tr_C and eighth switching device Tr8, connected to the charged third common node CN3 through the gate terminals thereof, are thus turned on. The turned-on control switching device Tr_C supplies the discharging voltage VSS to the first reset node QB1 such that the first reset node QB1 is stably maintained in its discharged state. Also, the turned-on eighth switching device Tr8 supplies the discharging voltage VSS to the second reset node QB2 such that the second reset node QB2 is more stably maintained in its discharged state.

In this manner, in the second initial period T0, the first and second set nodes Q1 and Q2 of the first stage ST1 are charged and the first and second reset nodes QB1 and QB2 of the first stage ST1 are discharged, thus enabling the first stage ST1.

Next, a description will be given of an operation in a first period T1. In the first period T1, only the first clock pulse CLK1 is maintained in the high state, and the remaining clock pulses CLK2 to CLK4, including the start pulse Vst, are maintained in the low state, as shown in FIG. 2.

As the first set node Q1 in the first stage ST1 is kept charged by the charging voltage VDD applied in the first initial period Ts, the first pull-up switching device Trpu1 in the first stage ST1 is kept turned on. At this time, as the first clock pulse CLK1 is applied to the drain terminal of the turned-on first pull-up switching device Trpu1, the charging voltage VDD charged at the floating first set node Q1 in the first stage ST1 is amplified by bootstrapping.

Accordingly, the first clock pulse CLK1 applied to the drain terminal of the first pull-up switching device Trpu1 in the first stage ST1 is stably output through the source terminal (first output terminal 111a) of the first pull-up switching device Trpu1. This first clock pulse CLK1 output through the first pull-up switching device Trpu1 is the first scan pulse Vout1. The first scan pulse Vout1 is supplied to the first gate line, second stage ST2 and upper dummy stage ST0. As a result, in the first period T1, the first gate line is driven, the second stage ST2 is enabled, and the upper dummy stage ST0 is disabled.

An operation of enabling the second stage ST2 in the first period T1 is performed in the same manner as the above-stated operation of enabling the first stage ST1 in the first initial period Ts. On the other hand, in the first period T1, the first scan pulse Vout1 output from the first stage ST1 is supplied to the upper dummy stage ST0 to disable the upper dummy stage ST0. This disabling operation will hereinafter be described in more detail.

That is, the first scan pulse Vout1 is supplied to the gate terminal of the reverse switching device Tr_R in the upper dummy stage ST0. As a result, the reverse switching device Tr_R is turned on and the reverse voltage V_R of the low state is supplied to the set node Q of the upper dummy stage ST0 through the turned-on reverse switching device Tr_R. Consequently, the set node Q is discharged and the pull-up switching device Trpu and third switching device Tr3, connected to the discharged set node Q through the gate terminals thereof, are thus turned off.

As the third switching device Tr3 in the upper dummy stage ST0 is turned off, the charging voltage VDD of the high state output through the second switching device Tr2 is supplied to the reset node QB in the upper dummy stage ST0. Hence, the reset node QB is charged and the pull-down switching device Trpd and first switching device Tr1 in the upper dummy stage ST0, connected to the charged reset node QB through the gate terminals thereof, are thus turned on. The turned-on pull-down switching device Trpd supplies the discharging voltage VSS to the first stage ST1.

The first switching device Tr1 in the upper dummy stage ST0 supplies the discharging voltage VSS to the set node Q in the upper dummy stage ST0, thereby more stably maintaining the set node Q in its discharged state.

Next, a description will be given of an operation in a second period T2. In the second period T2, only the first and second clock pulses CLK1 and CLK2 are maintained in the high state, and the remaining clock pulses CLK3 and CLK4, including the start pulse Vst, are maintained in the low state. The first pull-up switching device Trpu1 in the first stage ST1 outputs the first scan pulse Vout1 in a complete form in response to the first clock pulse CLK1. In this second period T2, the second stage ST2 is enabled by the first scan pulse Vout1.

Also, the second pull-up switching device Trpu2 in the first stage ST1 begins to output the second scan pulse Vout2 in response to the second clock pulse CLK2. That is, as the second set node Q2 in the first stage ST1 is kept charged by the charging voltage VDD applied in the first initial period Ts, the second pull-up switching device Trpu2 in the first stage ST1 is kept turned on. At this time, as the second clock pulse CLK2 is applied to the drain terminal of the turned-on second pull-up switching device Trpu2, the charging voltage VDD charged at the floating second set node Q2 in the first stage ST1 is amplified by bootstrapping.

Accordingly, the second clock pulse CLK2 applied to the drain terminal of the second pull-up switching device Trpu2 in the first stage ST1 is stably output through the source terminal (second output terminal 111b) of the second pull-up switching device Trpu2. This second clock pulse CLK2 output through the second pull-up switching device Trpu2 is the second scan pulse Vout2. The second scan pulse Vout2 is supplied to the second gate line to drive the second gate line.

Next, a description will be given of an operation in a third period T3. In the third period T3, only the second and third clock pulses CLK2 and CLK3 are maintained in the high state, and the remaining clock pulses CLK1 and CLK4, including the start pulse Vst, are maintained in the low state.

The second pull-up switching device Trpu2 in the first stage ST1 outputs the second scan pulse Vout2 in a complete form in response to the second clock pulse CLK2. This second scan pulse Vout2 is supplied to the second gate line. Also, the first pull-up switching device Trpu1 in the second stage ST2 begins to output the third scan pulse Vout3 in response to the third clock pulse CLK3.

In this third period T3, the third scan pulse Vout3 from the second stage ST2 is supplied to the third gate line to begin to drive the third gate line, and also supplied to the third stage ST3 to enable the third stage ST3.

Next, a description will be given of an operation in a fourth period T4. In the fourth period T4, only the third and fourth clock pulses CLK3 and CLK4 are maintained in the high state, and the remaining clock pulses CLK1 and CLK2, including the start pulse Vst, are maintained in the low state.

The first pull-up switching device Trpu1 in the second stage ST2 outputs the third scan pulse Vout3 in a complete form in response to the third clock pulse CLK3. This third scan pulse Vout3 is supplied to the third gate line and fourth stage ST4. Also, the second pull-up switching device Trpu2 in the second stage ST2 outputs the fourth scan pulse Vout4 in response to the fourth clock pulse CLK4. This fourth scan pulse Vout4 is supplied to the fourth gate line to begin to drive the fourth gate line, and also supplied to the first stage ST1 to disable the first stage ST1.

The operation of disabling the first stage ST1 will hereinafter be described in detail. That is, the fourth scan pulse Vout4 is supplied to each of the gate terminals of the first reverse switching device Tr_R1, second reverse switching device Tr_R2 and third reverse switching device Tr_R3 in the first stage ST1. As a result, the first reverse switching device Tr_R1, second reverse switching device Tr_R2 and third reverse switching device Tr_R3 are turned on.

The reverse voltage V_R of the low state is supplied to the first set node Q1 in the first stage ST1 through the turned-on first reverse switching device Tr_R1. As a result, the first set node Q1 is discharged and the first pull-up switching device Trpu1, third switching device Tr3, sixth switching device Tr6 and fifteenth switching device Tr15, connected to the discharged first set node Q1 through the gate terminals thereof, are thus turned off.

Also, the reverse voltage V_R of the low state is supplied to the second set node Q2 in the first stage ST1 through the turned-on second reverse switching device Tr_R2. As a result, the second set node Q2 is discharged and the second pull-up switching device Trpu2, eleventh switching device Tr11, fourteenth switching device Tr14 and seventh switching device Tr7, connected to the discharged second set node Q2 through the gate terminals thereof, are thus turned off.

Also, the reverse voltage V_R of the low state is supplied to the third common node CN3 in the first stage ST1 through the turned-on third reverse switching device Tr_R3. As a result, the third common node CN3 is discharged and the control switching device Tr_C and eighth switching device Tr8, connected to the discharged third common node CN3 through the gate terminals thereof, are thus turned off.

As the sixth and seventh switching devices Tr6 and Tr7 in the first stage ST1 are turned off, the first AC voltage Vac1 output through the fourth switching device Tr4 is supplied to the first common node CN1 in the first stage ST1. As a result, the first common node CN1 is charged and the fifth switching device Tr5, connected to the charged first common node CN1 through the gate terminal thereof, is thus turned on.

Then, the first AC voltage Vac1 is supplied to the first reset node QB1 in the first stage ST1 through the turned-on fifth switching device Tr5. As a result, the first reset node QB1 is charged and the first pull-down switching device Trpd1, third pull-down switching device Trpd3, first switching device Tr1 and ninth switching device Tr9 in the first stage ST1, connected to the charged first reset node QB1 through the gate terminals thereof, are thus turned on.

The discharging voltage VSS is supplied to the first set node Q1 in the first stage ST1 through the turned-on first switching device Tr1, thereby enabling the first set node Q1 to be more stably maintained in its discharged state. Also, the discharging voltage VSS is supplied to the second set node Q2 in the first stage ST1 through the turned-on ninth switching device Tr9, thereby enabling the second set node Q2 to be more stably maintained in its discharged state.

In this manner, in the fourth period T4, the first stage ST1 is disabled by discharging the first and second set nodes Q1 and Q2 in the first stage ST1, charging the first reset node QB1 in the first stage ST1 and discharging the second reset node QB2 in the first stage ST1.

As described above, in the fourth period T4, as the first pull-down switching device Trpd1 and third pull-down switching device Trpd3 of the first stage ST1 are turned on, the first pull-down switching device Trpd1 outputs the discharging voltage VSS through the first output terminal 111a to supply the discharging voltage VSS to the first gate line, second stage ST2 and upper dummy stage ST0, and the third pull-down switching device Trpd3 outputs the discharging voltage VSS through the second output terminal 111b to supply the discharging voltage VSS to the second gate line. Also, the subsequent fifth to lower dummy stages ST5 to STn+1 are sequentially driven in the same manner as the above. On the other hand, in a second frame period, the first AC voltage Vac1 is negative and the second AC voltage Vac2 is positive. Accordingly, in a disable period of the second frame period, the first reset node QB1 of each stage ST1 to STn is discharged and the second reset node QB2 thereof is charged. Consequently, in the disable period of the first frame period, the second and fourth pull-down switching devices Trpd2 and Trpd4 of each stage ST1 to STn are operated.

Next, a description will be given of the operation of the shift register based on the reverse driving mode with reference to FIGS. 3, 4, 5 and 6. Because the operation of the shift register is based on the reverse driving mode, the clock pulses CLK1 to CLK4 are output in order from the fourth clock pulse CLK4 to the first clock pulse CLK1, the forward voltage V_F is in the low state, and the reverse voltage V_R is in the high state, as shown in FIG. 3.

First, a description will be given of an operation in a first initial period Ts of a first frame period. In the first frame period, the first AC voltage Vac1 is positive and the second AC voltage Vac2 is negative. In the first initial period Ts, only the start pulse Vst output from the timing controller is maintained in the high state and the clock pulses CLK1 to CLK4 output from the timing controller are maintained in the low state, as shown in FIG. 3.

The start pulse Vst output from the timing controller is supplied to the upper dummy stage ST0 and the lower dummy stage STn+1. That is, as shown in FIG. 5, the start pulse Vst is supplied to the gate terminal of the reverse switching device Tr_R in the lower dummy stage STn+1. As a result, the reverse switching device Tr_R is turned on and the reverse voltage V_R of the high state is supplied to the set node Q through the turned-on reverse switching device Tr_R. Consequently, the set node Q is charged and the pull-up switching device Trpu and the third switching device Tr3, connected to the charged set node Q through the gate terminals thereof, are thus turned on.

The discharging voltage VSS is supplied to the reset node QB through the turned-on third switching device Tr3. On the other hand, because the second switching device Tr2 is always kept turned on by the charging voltage VDD, which is a DC voltage of the high state, the charging voltage VDD is supplied to the reset node QB through the second switching device Tr2. As a result, the charging voltage VDD of the high state output through the second switching device Tr2 and the discharging voltage VSS of the low state output through the third switching device Tr3 are together supplied to the reset node QB. At this time, because the size of the third switching device Tr3 is set to be larger than that of the second switching device Tr2, the reset node QB is discharged by the discharging voltage VSS of the low state supplied through the third switching device Tr3. Thus, the pull-down switching device Trpd and the first switching device Tr1, connected to the discharged reset node QB through the gate terminals thereof, are turned off.

On the other hand, because there is no output from the nth stage STn in the first initial period Ts, the forward switching device Tr_F in the lower dummy stage STn+1 remains turned off. In this manner, in the first initial period Ts, the lower dummy stage STn+1 is set. Meanwhile, in the first initial period Ts, the upper dummy stage ST0 supplied with the start pulse Vst is reset, which will hereinafter be described in more detail.

That is, as shown in FIG. 4, the start pulse Vst is supplied to the gate terminal of the forward switching device Tr_F in the upper dummy stage ST0. As a result, the forward switching device Tr_F is turned on and the forward voltage V_F of the low state is supplied to the set node Q through the turned-on forward switching device Tr_F. Consequently, the set node Q is discharged and the pull-up switching device Trpu and the third switching device Tr3, connected to the discharged set node Q through the gate terminals thereof, are thus turned off.

Because the second switching device Tr2 is always kept on by the charging voltage VDD, which is a DC voltage of the high state, the charging voltage VDD is supplied to the reset node QB through the second switching device Tr2. As a result, the reset node QB is charged and the pull-down switching device Trpd and the first switching device Tr1, connected to the charged reset node QB through the gate terminals thereof, are thus turned on.

The turned-on first switching device Tr1 supplies the discharging voltage VSS to the set node Q such that the set node Q is more stably maintained in its discharged state. Also, the turned-on first switching device Tr1 supplies the discharging voltage VSS to the first stage ST1. In this manner, in the first initial period Ts, the upper dummy stage ST0 is reset.

Next, a description will be given of an operation in a second initial period T0. In the second initial period T0, only the second dummy clock pulse DCLK2 is maintained in the high state, and the start pulse Vst and all the clock pulses CLK1 to CLK4 are maintained in the low state. In the second initial period T0, the start pulse Vst goes from the high state to the low state and the reverse switching device Tr_R in the lower dummy stage STn+1 is thus turned off, thereby causing the set node Q in the lower dummy stage STn+1 to float. As a result, the charging voltage VDD supplied to the set node Q in the lower dummy stage STn+1 in the first initial period Ts is maintained at the set node Q even in the second initial period T0 as it is.

As the set node Q in the lower dummy stage STn+1 is kept charged by the charging voltage VDD applied in the first initial period Ts, the pull-up switching device Trpu and third switching device Tr3 in the lower dummy stage STn+1 are kept turned on. At this time, as the second dummy clock pulse DCLK2 is applied to the drain terminal of the turned-on pull-up switching device Trpu, the charging voltage VDD charged at the floating set node Q in the lower dummy stage STn+1 is amplified by bootstrapping.

Accordingly, the second dummy clock pulse DCLK2 applied to the drain terminal of the pull-up switching device Trpu in the lower dummy stage STn+1 is stably output through the source terminal (output terminal) of the pull-up switching device Trpu. This second dummy clock pulse DCLK2 output through the pull-up switching device Trpu is the lower dummy scan pulse Vout2n+1. The lower dummy scan pulse Vout2n+1 is supplied to the nth stage STn to act to enable the nth stage STn. That is, the lower dummy scan pulse Vout2n+1 output from the lower dummy stage STn+1 is supplied to each of the gate terminals of the first reverse switching device Tr_R1, third reverse switching device Tr_R3 and second reverse switching device Tr_R2 in the nth stage STn.

Then, the first reverse switching device Tr_R1, third reverse switching device Tr_R3 and second reverse switching device Tr_R2 are turned on, thereby causing the reverse voltage V_R of the high state to be applied to the first set node Q1 through the turned-on first reverse switching device Tr_R1. As a result, the first set node Q1 is charged and the first pull-up switching device Trpu1, third switching device Tr3, sixth switching device Tr6 and fifteenth switching device Tr15, connected to the charged first set node Q1 through the gate terminals thereof, are thus turned on. The discharging voltage VSS is supplied to the first reset node QB1 through the turned-on third switching device Tr3, so that the first reset node QB1 is discharged. As a result, the first pull-down switching device Trpd1, first switching device Tr1, third pull-down switching device Trpd3 and ninth switching device Tr9, connected to the first reset node QB1 through the gate terminals thereof, are turned off.

On the other hand, because the first AC voltage Vac1 is maintained in the high state for the first frame period, the fourth switching device Tr4 supplied with the first AC voltage Vac1 is kept turned on for the first frame period. The first AC voltage Vac1 is supplied to the first common node CN1 of the nth stage STn through the turned-on fourth switching device Tr4. At this time, the discharging voltage VSS output through the turned-on sixth switching device Tr6 is also supplied to the first common node CN1. That is, the first AC voltage Vac1 of the high state and the discharging voltage VSS of the low state are together supplied to the first common node CN1.

Notably, because the size of the sixth switching device Tr6 supplying the discharging voltage VSS is set to be larger than that of the fourth switching device Tr4 supplying the first AC voltage Vac1, the discharging voltage VSS is maintained at the first common node CN1. On the other hand, the discharging voltage VSS output through the turned-on seventh switching device Tr7 is further supplied to the first common node CN1, as will be described later. As a result, the first common node CN1 is discharged and the fifth switching device Tr5, connected to the discharged first common node CN1 through the gate terminal thereof, is thus turned off.

On the other hand, in the second initial period T0, the reverse voltage V_R of the high state is applied to the second set node Q2 through the turned-on second reverse switching device Tr_R2. As a result, the second set node Q2 is charged and the second pull-up switching device Trpu2, eleventh switching device Tr11, fourteenth switching device Tr14 and seventh switching device Tr7, connected to the charged second set node Q2 through the gate terminals thereof, are thus turned on. The discharging voltage VSS is supplied to the second reset node QB2 through the turned-on eleventh switching device Tr11, so that the second reset node QB2 is discharged. As a result, the fourth pull-down switching device Trpd4, tenth switching device Tr10, second pull-down switching device Trpd2 and second switching device Tr2, connected to the second reset node QB2 through the gate terminals thereof, are turned off.

On the other hand, because the second AC voltage Vac2 is maintained in the low state for the first frame period, the twelfth switching device Tr12 supplied with the second AC voltage Vac2 is kept turned off for the first frame period.

The discharging voltage VSS output through the turned-on fifteenth switching device Tr15 is supplied to the second common node CN2. As a result, the second common node CN2 is discharged and the thirteenth switching device Tr13, connected to the discharged second common node CN2 through the gate terminal thereof, is turned off.

On the other hand, in the second initial period T0, the reverse voltage V_R of the high state is applied to the third common node CN3 through the turned-on third reverse switching device Tr_R3. As a result, the third common node CN3 is charged and the control switching device Tr_C and eighth switching device Tr8, connected to the charged third common node CN3 through the gate terminals thereof, are thus turned on. The turned-on control switching device Tr_C supplies the discharging voltage VSS to the first reset node QB1 such that the first reset node QB1 is stably maintained in its discharged state. Also, the turned-on eighth switching device Tr8 supplies the discharging voltage VSS to the second reset node QB2 such that the second reset node QB2 is more stably maintained in its discharged state. In this manner, in the second initial period T0, the first and second set nodes Q1 and Q2 of the nth stage STn are charged and the first and second reset nodes QB1 and QB2 of the nth stage STn are discharged, thus enabling the nth stage STn.

Next, a description will be given of an operation in a first period T1. In the first period T1, only the fourth clock pulse CLK4 is maintained in the high state, and the remaining clock pulses CLK1 to CLK3, including the start pulse Vst, are maintained in the low state, as shown in FIG. 3.

As the second set node Q2 in the nth stage STn is kept charged by the charging voltage VDD applied in the first initial period Ts, the second pull-up switching device Trpu2 in the nth stage STn is kept turned on. At this time, as the fourth clock pulse CLK4 is applied to the drain terminal of the turned-on second pull-up switching device Trpu2, the charging voltage VDD charged at the floating second set node Q2 in the nth stage STn is amplified by bootstrapping.

Accordingly, the fourth clock pulse CLK4 applied to the drain terminal of the second pull-up switching device Trpu2 in the nth stage STn is stably output through the source terminal (second output terminal 111b) of the second pull-up switching device Trpu2. This fourth clock pulse CLK4 output through the second pull-up switching device Trpu2 is the mth scan pulse. The mth scan pulse is supplied to the mth gate line, (n−1)th stage STn−1 and lower dummy stage STn+1. As a result, in the first period T1, the mth gate line is driven, the (n−1)th stage STn−1 is enabled, and the lower dummy stage STn+1 is disabled. An operation of enabling the (n−1)th stage STn−1 in the first period T1 is performed in the same manner as the above-stated operation of enabling the nth stage STn in the first initial period Ts.

On the other hand, in the first period T1, the mth scan pulse output from the nth stage STn is supplied to the lower dummy stage STn+1 to disable the lower dummy stage STn+1. This disabling operation will hereinafter be described in more detail.

That is, the mth scan pulse is supplied to the gate terminal of the forward switching device Tr_F in the lower dummy stage STn+1. As a result, the forward switching device Tr_F is turned on and the forward voltage V_F of the low state is supplied to the set node Q of the lower dummy stage STn+1 through the turned-on forward switching device Tr_F. Consequently, the set node Q is discharged and the pull-up switching device Trpu and third switching device Tr3, connected to the discharged set node Q through the gate terminals thereof, are thus turned off.

As the third switching device Tr3 in the lower dummy stage STn+1 is turned off, the charging voltage VDD of the high state output through the second switching device Tr2 is supplied to the reset node QB in the lower dummy stage STn+1. Hence, the reset node QB is charged and the pull-down switching device Trpd and first switching device Tr1 in the lower dummy stage STn+1, connected to the charged reset node QB through the gate terminals thereof, are thus turned on. The turned-on pull-down switching device Trpd supplies the discharging voltage VSS to the nth stage STn.

The first switching device Tr1 in the lower dummy stage STn+1 supplies the discharging voltage VSS to the set node Q in the lower dummy stage STn+1, so as to more stably maintain the set node Q in its discharged state.

Next, a description will be given of an operation in a second period T2. In the second period T2, only the fourth and third clock pulses CLK4 and CLK3 are maintained in the high state, and the remaining clock pulses CLK2 and CLK1, including the start pulse Vst, are maintained in the low state. The second pull-up switching device Trpu2 in the nth stage STn outputs the mth scan pulse in a complete form in response to the fourth clock pulse CLK4. In this second period T2, the (n−1)th stage STn−1 is enabled by the mth scan pulse. Also, the first pull-up switching device Trpu1 in the nth stage STn begins to output the (m−1)th scan pulse in response to the third clock pulse CLK3. That is, as the first set node Q1 in the nth stage STn is kept charged by the charging voltage VDD applied in the first initial period Ts, the first pull-up switching device Trpu1 in the nth stage STn is kept turned on. At this time, as the third clock pulse CLK3 is applied to the drain terminal of the turned-on first pull-up switching device Trpu1, the charging voltage VDD charged at the floating first set node Q1 in the nth stage STn is amplified by bootstrapping.

Accordingly, the third clock pulse CLK3 applied to the drain terminal of the first pull-up switching device Trpu1 in the nth stage STn is stably output through the source terminal (first output terminal 111a) of the first pull-up switching device Trpu1. This third clock pulse CLK3 output through the first pull-up switching device Trpu1 is the (m−1)th scan pulse. The (m−1)th scan pulse is supplied to the (m−1)th gate line to drive the (m−1)th gate line.

Next, a description will be given of an operation in a third period T3. In the third period T3, only the third and second clock pulses CLK3 and CLK2 are maintained in the high state, and the remaining clock pulses CLK4 and CLK1, including the start pulse Vst, are maintained in the low state. The first pull-up switching device Trpu1 in the nth stage STn outputs the (m−1)th scan pulse in a complete form in response to the third clock pulse CLK3. This (m−1)th scan pulse is supplied to the (m−1)th gate line. Also, the second pull-up switching device Trpu2 in the (n−1)th stage STn−1 begins to output the (m−2)th scan pulse in response to the second clock pulse CLK2. In this third period T3, the (m−2)th scan pulse from the (n−1)th stage STn−1 is supplied to the (m−2)th gate line to begin to drive the (m−2)th gate line, and also supplied to the (n−2)th stage to enable the (n−2)th stage.

Next, a description will be given of an operation in a fourth period T4. In the fourth period T4, only the second and first clock pulses CLK2 and CLK1 are maintained in the high state, and the remaining clock pulses CLK4 and CLK3, including the start pulse Vst, are maintained in the low state. The second pull-up switching device Trpu2 in the (n−1)th stage STn−1 outputs the (m−2)th scan pulse in a complete form in response to the second clock pulse CLK2. This (m−2)th scan pulse is supplied to the (m−2)th gate line and (n−3)th stage. Also, the first pull-up switching device Trpu1 in the (n−1)th stage STn−1 outputs the (m−3)th scan pulse in response to the first clock pulse CLK1. This (m−3)th scan pulse is supplied to the (m−3)th gate line to begin to drive the (m−3)th gate line, and also supplied to the nth stage STn to disable the nth stage STn.

The operation of disabling the nth stage STn will hereinafter be described in detail. That is, the (m−3)th scan pulse is supplied to each of the gate terminals of the first forward switching device Tr_F1, second forward switching device Tr_F2 and third forward switching device Tr_F3 in the nth stage STn. As a result, the first forward switching device Tr_F1, second forward switching device Tr_F2 and third forward switching device Tr_F3 are turned on.

The forward voltage V_F of the low state is supplied to the first set node Q1 in the nth stage STn through the turned-on first forward switching device Tr_F1. As a result, the first set node Q1 is discharged and the first pull-up switching device Trpu1, third switching device Tr3, sixth switching device Tr6 and fifteenth switching device Tr15, connected to the discharged first set node Q1 through the gate terminals thereof, are thus turned off. Also, the forward voltage V_F of the low state is supplied to the second set node Q2 in the nth stage STn through the turned-on second forward switching device Tr_F2. As a result, the second set node Q2 is discharged and the second pull-up switching device Trpu2, eleventh switching device Tr11, fourteenth switching device Tr14 and seventh switching device Tr7, connected to the discharged second set node Q2 through the gate terminals thereof, are thus turned off. Also, the forward voltage V_F of the low state is supplied to the third common node CN3 in the nth stage STn through the turned-on third forward switching device Tr_F3. As a result, the third common node CN3 is discharged and the control switching device Tr_C and eighth switching device Tr8, connected to the discharged third common node CN3 through the gate terminals thereof, are thus turned off.

As the sixth and seventh switching devices Tr6 and Tr7 in the nth stage STn are turned off, the first AC voltage Vac1 output through the fourth switching device Tr4 is supplied to the first common node CN1 in the nth stage STn. As a result, the first common node CN1 is charged and the fifth switching device Tr5, connected to the charged first common node CN1 through the gate terminal thereof, is thus turned on.

Then, the first AC voltage Vac1 is supplied to the first reset node QB1 in the nth stage STn through the turned-on fifth switching device Tr5. As a result, the first reset node QB1 is charged and the first pull-down switching device Trpd1, third pull-down switching device Trpd3, first switching device Tr1 and ninth switching device Tr9 in the nth stage STn, connected to the charged first reset node QB1 through the gate terminals thereof, are thus turned on.

The discharging voltage VSS is supplied to the first set node Q1 in the nth stage STn through the turned-on first switching device Tr1, thereby enabling the first set node Q1 to be more stably maintained in its discharged state. Also, the discharging voltage VSS is supplied to the second set node Q2 in the nth stage STn through the turned-on ninth switching device Tr9, thereby enabling the second set node Q2 to be more stably maintained in its discharged state.

In this manner, in the fourth period T4, the nth stage STn is disabled by discharging the first and second set nodes Q1 and Q2 in the nth stage STn, charging the first reset node QB1 in the nth stage STn and discharging the second reset node QB2 in the nth stage STn.

As described above, in the fourth period T4, as the first pull-down switching device Trpd1 and third pull-down switching device Trpd3 of the nth stage STn are turned on, the first pull-down switching device Trpd1 outputs the discharging voltage VSS through the first output terminal 111*a* to supply the discharging voltage VSS to the (m−1)th gate line, and the third pull-down switching device Trpd3 outputs the discharging voltage VSS through the second output terminal 111*b* to supply the discharging voltage VSS to the mth gate line, (n−1)th stage STn−1 and lower dummy stage STn+1. Also, the subsequent (n−4)th stage to upper dummy stage ST0 are sequentially driven in the same manner as the above.

On the other hand, in a second frame period, the first AC voltage Vac1 is negative and the second AC voltage Vac2 is positive. Accordingly, in a disable period of the second frame period, the first reset node QB1 of each stage ST1 to STn is discharged and the second reset node QB2 thereof is charged. Consequently, in the disable period of the first frame period, the second and fourth pull-down switching devices Trpd2 and Trpd4 of each stage ST1 to STn are operated.

In this manner, in accordance with the present invention, the scan pulse output direction of each stage can be controlled through the scan direction controller SDC. On the other hand, each of the upper and lower dummy stages ST0 and STn+1 may have the same circuit configuration as that of each of the first to nth stages ST1 to STn.

Figure 7:
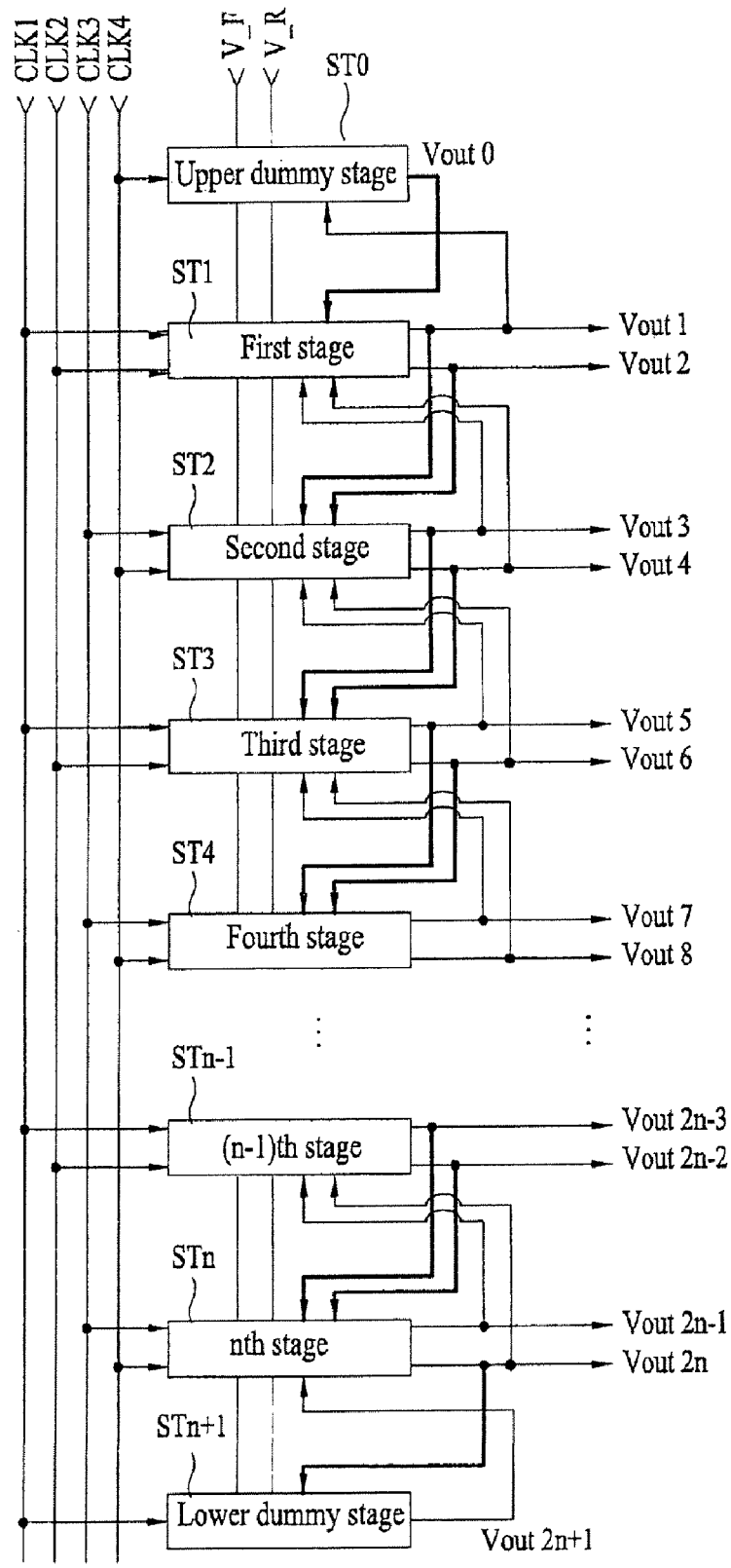
FIG. 7 is a block diagram showing the configuration of a shift register according to a second exemplary embodiment of the present invention.

FIG. 7 is a block diagram showing the configuration of a shift register according to a second exemplary embodiment of the present invention. The shift register according to the second embodiment of the present invention comprises n stages ST1 to STn and two dummy stages ST0 and STn+1, as shown in FIG. 7. Each of the stages ST1 to STn outputs two scan pulses for one frame period. Each of the stages ST1 to STn drives gate lines connected thereto using the scan pulses and controls the operations of a stage downstream therefrom and a stage upstream therefrom using the scan pulses. The shift register according to the second exemplary embodiment is supplied with signals as shown in FIG. 2 in forward driving and signals as shown in FIG. 3 in reverse driving. Also, the upper dummy stage ST0 and lower dummy stage STn+1 in the shift register according to the second embodiment are the same as the upper dummy stage ST0 and lower dummy stage STn+1 in the shift register according to the first embodiment, respectively.

The shift register according to the second exemplary embodiment is generally the same as the shift register according to the first embodiment, with the exception of an interstage signal transfer system. This difference will hereinafter be described.

First, a description will be given of an enabling operation. In the forward driving mode, each stage ST1 to STn is enabled in response to two scan pulses from a stage upstream therefrom. That is, each stage ST1 to STn includes two sub-stages. One of the two sub-stages outputting a scan pulse earlier is enabled in response to an earlier output one of the two scan pulses from the upstream stage. In contrast, the other one of the two sub-stages outputting a scan pulse later is enabled in response to a later output one of the two scan pulses from the upstream stage. In detail, one of two sub-stages in a jth stage outputting a scan pulse earlier is enabled in response to an earlier output one of two scan pulses from a (j−1)th stage, and the other one of the two sub-stages in the jth stage outputting a scan pulse later is enabled in response to a later output one of the two scan pulses from the (j−1)th stage.

For example, one of the two sub-stages in the third stage ST3 outputting the fifth scan pulse Vout5 is enabled in response to the third scan pulse Vout3 from the second stage ST2, and the other one of the two sub-stages in the third stage ST3 outputting the sixth scan pulse Vout6 is enabled in response to the fourth scan pulse Vout4 from the second stage ST2. However, in the forward driving mode, the top stage, or first stage ST1, is enabled in response to the upper dummy scan pulse Vout0 from the upper dummy stage ST0. The upper dummy stage ST0 is enabled in response to the start pulse Vst from the start transfer line.

In contrast, in the reverse driving mode, each stage ST1 to STn is enabled in response to two scan pulses from a stage downstream therefrom. That is, each stage ST1 to STn includes two sub-stages. One of the two sub-stages outputting a scan pulse earlier is enabled in response to an earlier output one of the two scan pulses from the downstream stage. In contrast, the other one of the two sub-stages outputting a scan pulse later is enabled in response to a later output one of the two scan pulses from the downstream stage. In detail, one of two sub-stages in a jth stage outputting a scan pulse earlier is enabled in response to an earlier output one of two scan pulses from a (j+1)th stage, and the other one of the two sub-stages in the jth stage outputting a scan pulse later is enabled in response to a later output one of the two scan pulses from the (j+1)th stage. For example, one of the two sub-stages in the third stage ST3 outputting the fifth scan pulse Vout5 is enabled in response to the seventh scan pulse Vout7 from the fourth stage ST4, and the other one of the two sub-stages in the third stage ST3 outputting the sixth scan pulse Vout6 is enabled in response to the eighth scan pulse Vout8 from the fourth stage ST4.

However, in the reverse driving mode, the bottom stage, or nth stage STn, is enabled in response to the lower dummy scan pulse Vout2n+1 from the lower dummy stage STn+1. The lower dummy stage STn+1 is enabled in response to the start pulse Vst from the start transfer line.

Next, a description will be given of a disabling operation. In the forward driving mode, each stage ST1 to STn is disabled in response to two scan pulses from a stage downstream therefrom. That is, each stage ST1 to STn includes two sub-stages. One of the two sub-stages outputting a scan pulse earlier is disabled in response to an earlier output one of the two scan pulses from the downstream stage. In contrast, the other one of the two sub-stages outputting a scan pulse later is disabled in response to a later output one of the two scan pulses from the downstream stage. In detail, one of two sub-stages in a jth stage outputting a scan pulse earlier is disabled in response to an earlier output one of two scan pulses from a (j+1)th stage, and the other one of the two sub-stages in the jth stage outputting a scan pulse later is disabled in response to a later output one of the two scan pulses from the (j+1)th stage. For example, one of the two sub-stages in the third stage ST3 outputting the fifth scan pulse Vout5 is disabled in response to the seventh scan pulse Vout7 from the fourth stage ST4, and the other one of the two sub-stages in the third stage ST3 outputting the sixth scan pulse Vout6 is disabled in response to the eighth scan pulse Vout8 from the fourth stage ST4.

However, in the forward driving mode, the bottom stage, or nth stage STn, is disabled in response to the lower dummy scan pulse Vout2n+1 from the lower dummy stage STn+1. The lower dummy stage STn+1 is disabled in response to the start pulse Vst from the start transfer line.

In contrast, in the reverse driving mode, each stage ST1 to STn is disabled in response to two scan pulses from a stage upstream therefrom. That is, each stage ST1 to STn includes two sub-stages. One of the two sub-stages outputting a scan pulse earlier is disabled in response to an earlier output one of the two scan pulses from the upstream stage. In contrast, the other one of the two sub-stages outputting a scan pulse later is disabled in response to a later output one of the two scan pulses from the upstream stage. In detail, one of two sub-stages in a jth stage outputting a scan pulse earlier is disabled in response to an earlier output one of two scan pulses from a (j−1)th stage, and the other one of the two sub-stages in the jth stage outputting a scan pulse later is disabled in response to a later output one of the two scan pulses from the (j−1)th stage. For example, one of the two sub-stages in the third stage ST3 outputting the fifth scan pulse Vout5 is disabled in response to the third scan pulse Vout3 from the second stage ST2, and the other one of the two sub-stages in the third stage ST3 outputting the sixth scan pulse Vout6 is disabled in response to the fourth scan pulse Vout4 from the second stage ST2.

However, in the reverse driving mode, the top stage, or first stage ST1, is disabled in response to the upper dummy scan pulse Vout0 from the upper dummy stage ST0. The upper dummy stage ST0 is disabled in response to the start pulse Vst from the start transfer line.

Figure 8:
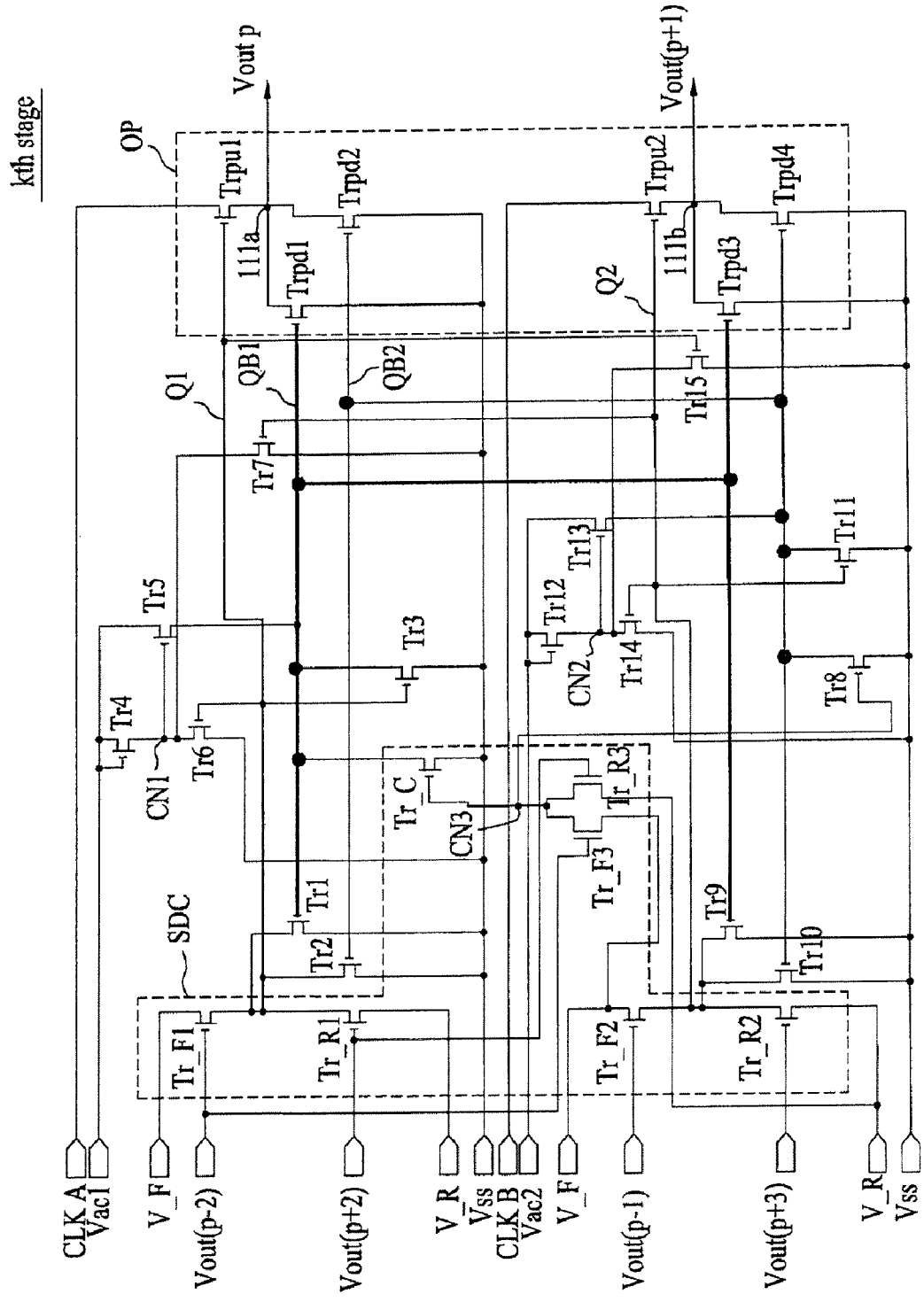
FIG. 8 is a circuit diagram of each stage in FIG. 7.

FIG. 8 is a circuit diagram of each stage ST1 to STn in FIG. 7. The structure of FIG. 8 is substantially the same as that of FIG. 6, with the exception of scan pulses supplied to the respective gate terminals of the second forward switching device, first reverse switching device and third reverse switching device.

According to the structure of FIG. 8, the second forward switching device Tr_F2 in the kth stage is turned on/off in response to the later output one of the two scan pulses from the (k−1)th stage, and is connected between the forward voltage line and the second set node Q2. To this end, the second forward switching device Tr_F2 in the kth stage has a gate terminal connected to the second output terminal 111b of the (k−1)th stage, a drain terminal connected to the forward voltage line, and a source terminal connected to the second set node Q2.

The first reverse switching device Tr_R1 in the kth stage is turned on/off in response to the earlier output one of the two scan pulses from the (k+1)th stage, and is connected between the first set node Q1 and the reverse voltage line. To this end, the first reverse switching device Tr_R1 in the kth stage has a gate terminal connected to the first output terminal 111a of the (k+1)th stage, a drain terminal connected to the first set node Q1, and a source terminal connected to the reverse voltage line.

The third reverse switching device Tr_R3 in the kth stage is turned on/off in response to the earlier output one of the two scan pulses from the (k+1)th stage, and is connected between the reverse voltage line and the third common node CN3. To this end, the third reverse switching device Tr_R3 has a gate terminal connected to the first output terminal 111a of the (k+1)th stage, a drain terminal connected to the reverse voltage line, and a source terminal connected to the third common node CN3.

Figure 9A:
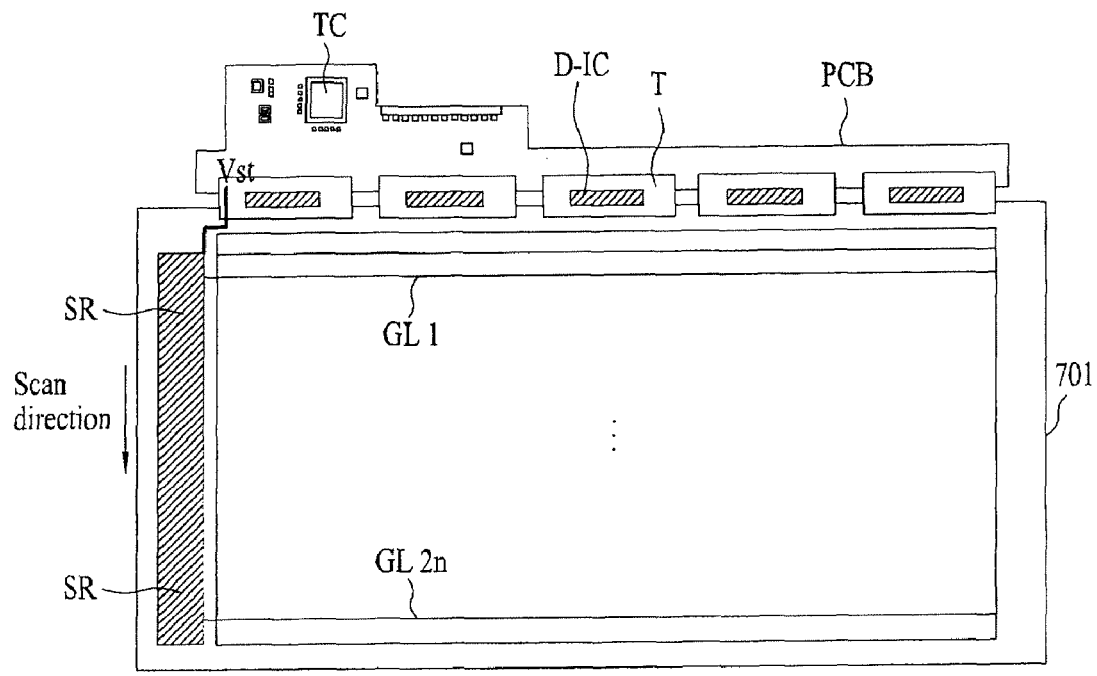
FIGS. 9A and 9B are schematic views of a liquid crystal display device with a fluorescent lamp backlight, and a liquid crystal display device with a light emitting diode backlight, respectively.
Figure 9B:
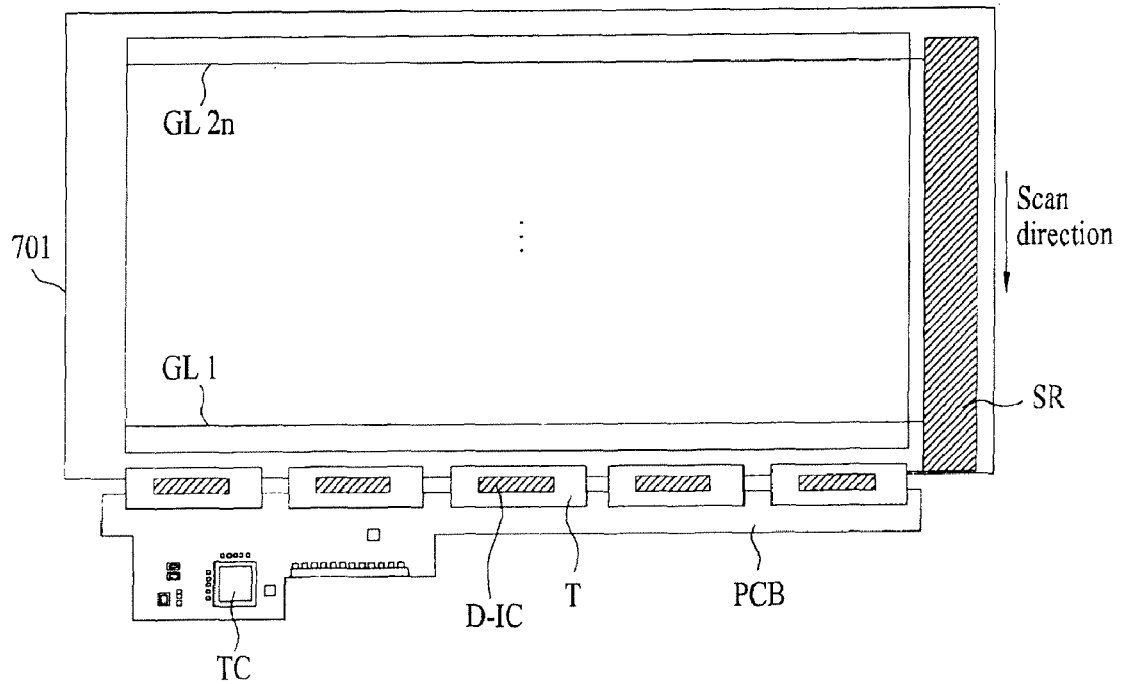

A shift register according to the present invention can be provided in liquid crystal display devices as follows. FIGS. 9A and 9B are schematic views of a liquid crystal display device with a fluorescent lamp backlight, and a liquid crystal display device with a light emitting diode backlight, respectively.

The above-described shift register SR is mounted in a non-display region of a liquid crystal panel 701. In order to apply the liquid crystal panel 701 to both the liquid crystal display device with the backlight of the fluorescent lamp driving type and the liquid crystal display device with the backlight of the light emitting diode driving type, it may be necessary to rotate the liquid crystal panel 701 by 180°.

For example, as shown in FIG. 9A, when the liquid crystal panel 701 is mounted in the liquid crystal display device with the backlight of the fluorescent lamp driving type, the first gate line GL1 is located at the top side of the liquid crystal panel 701 and the last gate line GL2n is located at the bottom side of the liquid crystal panel 701.

However, when the liquid crystal panel 701 is mounted in the liquid crystal display device with the backlight of the light emitting diode driving type, it may be necessary to rotate the liquid crystal panel 701 by 180° due to a systematic difference between the two devices. In this case, the first gate line GL1 is located at the bottom side of the liquid crystal panel 701 and the last gate line GL2n is located at the top side of the liquid crystal panel 701.

Assuming that the data output order of the data driver is not changed, the uppermost gate line of the screen of the liquid crystal panel 701 must first be driven irrespective of the location of the first gate line GL1 of the liquid crystal panel 701 to normally display an image on the screen of the liquid crystal panel 701.

In detail, the gate lines of the liquid crystal panel 701 as shown in FIG. 9A must be driven beginning with the first gate line GL1 located at the top side of the liquid crystal panel 701, and the gate lines of the liquid crystal panel 701 as shown in FIG. 9B must be driven beginning with the last gate line GL2n located at the top side of the liquid crystal panel 701.

The use of the first or second shift register SR according to the present invention can satisfy both the driving orders of the two devices. For example, in the liquid crystal display device as shown in FIG. 9A, the gate lines of the liquid crystal panel 701 can be driven beginning with the first gate line GL1 located at the top side of the liquid crystal panel 701 by operating the shift register SR in the forward driving mode. In contrast, in the liquid crystal display device as shown in FIG. 9B, the gate lines of the liquid crystal panel 701 can be driven beginning with the last gate line GL2n located at the top side of the liquid crystal panel 701 by operating the shift register SR in the reverse driving mode.

On the other hand, the reference character D-IC, not described, denotes a data driver integrated circuit (IC) which drives the data lines of the liquid crystal panel, T denotes a tape carrier package (TCP) in which the data driver IC is mounted, and PCB denotes a data printed circuit board in which a timing controller TC is mounted. A plurality of TCPs T make connections between the data printed circuit board PCB and the liquid crystal panel 701.

As apparent from the above description, a shift register according to the present invention has effects as follows. The shift register of the present invention can change the output order of stages through a scan direction controller. Therefore, the shift register of the present invention is applicable to display devices of various models. In addition, a third forward switching device and a third reverse switching device act to complement each other's operations in a forward operation and a reverse operation, thereby enabling forward driving and reverse driving to be effectively done without no additional switching device. Therefore, the internal area of the shift register can be reduced.

It will be apparent to those skilled in the art that various modifications and variations can be made in the shift register of the present invention without departing from the spirit or scope of the invention. Thus, it is intended that the present invention covers the modifications and variations of this invention provided they come within the scope of the appended claims and their equivalents.

What is claimed is:

1. A shift register, comprising:
a plurality of scan stages to output scan pulses to a plurality of gate lines;
a first dummy stage to output a first dummy scan pulse to a first of the plurality of scan stages; and
a second dummy stage to output a second dummy scan pulse to a last of the plurality of scan stages,
wherein each of the plurality of scan stages includes a scan direction controller to selectively output a forward voltage and a reverse voltage having opposite voltage levels in response to the scan pulse from a prior stage and a later stage,
wherein each of the plurality of scan stages further includes an output unit to sequentially output a first scan pulse and a second scan pulse based on voltages of a plurality of set nodes and reset nodes and to supply the first and second scan pulses to the latter stage and to the prior stage, respectively,
wherein the first scan pulse is output earlier than the second scan pulse, and
wherein the first scan pulse is supplied to the latter stage, and the second scan pulse is supplied to the prior stage.

2. The shift register of claim 1, wherein:
the first dummy scan pulse sets the first of the plurality of scan stages in a forward direction and resets the first of the plurality of scan stages in a reverse direction; and
the second dummy scan pulse resets the last of the plurality of scan stages in the forward direction and sets the last of the plurality of scan stages in the reverse direction.

3. The shift register of claim 1, wherein each of the plurality of scan stages is connected to two gate lines.

4. The shift register of claim 1, wherein each of the plurality of scan stages further includes a node controller to control signal states of a plurality of set nodes and reset nodes in response to an output signal from the scan direction controller.

5. The shift register of claim 1, wherein the first dummy stage includes:
a first scan direction controller to selectively output a forward voltage and a reverse voltage having opposite voltage levels in response to an external start pulse;
a first node controller to control signal states of first and second nodes of the first dummy stage in response to an output signal from the first scan direction controller; and
a first output unit to output the first dummy scan pulse based on voltages of the first and second nodes of the first dummy stage and to supply the first dummy scan pulse to the first of the plurality of scan stages.

6. The shift register of claim 1, wherein the second dummy stage includes:
a second scan direction controller to selectively output a forward voltage and a reverse voltage having opposite levels in response to an external start pulse;
a second node controller to control signal states of first and second nodes of the second dummy stage in response to an output signal from the second scan direction controller; and
a second output unit to output the second dummy scan pulse based on voltages of the first and second nodes of the second dummy stage and to supply the second dummy scan pulse to the last of the plurality of scan stages.

7. The shift register of claim 1, wherein:
each of the plurality of scan stages sequentially outputs the scan pulse in response to any two of a plurality of clock pulses, the plurality of clock pulses being out of phase with each other;
the first dummy stage outputs the first dummy scan pulse in response to a first dummy clock pulse included in any one of the plurality of clock pulses; and
the second dummy stage outputs the second dummy scan pulse in response to a second dummy clock pulse included in another one of the plurality of clock pulses.

* * * * *